US012575042B2

(12) United States Patent
Wang et al.

(10) Patent No.: US 12,575,042 B2
(45) Date of Patent: Mar. 10, 2026

(54) DISPLAY DEVICE INCLUDING SLIDE SUPPORT ASSEMBLY

(71) Applicant: BOE Technology Group Co., Ltd., Beijing (CN)

(72) Inventors: Zongyuan Wang, Beijing (CN); Hong Zhu, Beijing (CN); Junhuan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 190 days.

(21) Appl. No.: 18/289,117

(22) PCT Filed: Oct. 28, 2022

(86) PCT No.: PCT/CN2022/128321
§ 371 (c)(1),
(2) Date: Nov. 1, 2023

(87) PCT Pub. No.: WO2024/087181
PCT Pub. Date: May 2, 2024

(65) Prior Publication Data
US 2025/0098080 A1 Mar. 20, 2025

(51) Int. Cl.
*H05K 5/02* (2006.01)
(52) U.S. Cl.
CPC .................................. *H05K 5/0217* (2013.01)
(58) Field of Classification Search
CPC ............. H04M 1/0239; H04M 1/0237; H04M 1/0268; G09F 9/301
See application file for complete search history.

(56) References Cited

U.S. PATENT DOCUMENTS

2020/0093011 A1* 3/2020 Lee .......................... H05K 5/03
2022/0155823 A1 5/2022 Shin et al.
(Continued)

FOREIGN PATENT DOCUMENTS

CN       111641743 A       9/2020
CN       112799470 A       5/2021
(Continued)

OTHER PUBLICATIONS

Extended European search report of counterpart European application No. 22963163.5 issued on Mar. 25, 2025, total 9 pages.

*Primary Examiner* — Sagar Shrestha
*Assistant Examiner* — Peter Krim
(74) *Attorney, Agent, or Firm* — XSENSUS LLP

(57) ABSTRACT

Provided is a display device. The display device includes: a flexible display panel, including a planar display portion, a rollable display portion, and a non-display fixed portion, wherein the rollable display portion is disposed between the planar display portion and the non-display fixed portion; a first housing, fixedly connected to the planar display portion; a second housing, slidably connected to the first housing; a reel, wherein both ends of the reel are connected to a side of the support housing, and the rollable display portion is wound over the reel; a connecting plate, disposed between the support housing and the rear cover and fixedly connected to the non-display fixed portion; a tension assembly, connected to the first housing and the connecting plate; and a slide support assembly, disposed between the connecting plate and the rear cover.

20 Claims, 13 Drawing Sheets

(56) References Cited

U.S. PATENT DOCUMENTS

| | | | |
|---|---|---|---|
| 2022/0232716 A1 | 7/2022 | Lim et al. | |
| 2022/0240400 A1 | 7/2022 | Zhou | |
| 2022/0311848 A1* | 9/2022 | Delaporte | G06F 1/1652 |
| 2023/0100316 A1* | 3/2023 | Chen | G06F 1/1624 |
| | | | 361/807 |
| 2023/0164248 A1 | 5/2023 | Park et al. | |
| 2023/0247783 A1* | 8/2023 | Cho | G06F 1/16 |
| | | | 361/807 |
| 2023/0276585 A1* | 8/2023 | Lee | C09J 9/00 |
| | | | 361/807 |
| 2024/0422924 A1* | 12/2024 | Kim | G06F 1/1652 |

FOREIGN PATENT DOCUMENTS

| | | | |
|---|---|---|---|
| CN | 112863331 A | 5/2021 | |
| CN | 113593411 A | 11/2021 | |
| CN | 113791669 A | 12/2021 | |
| CN | 113808490 A | 12/2021 | |
| CN | 113851042 A | 12/2021 | |
| CN | 113890915 A | 1/2022 | |
| CN | 114333576 A | 4/2022 | |
| CN | 114338869 A | 4/2022 | |
| CN | 114697431 A | 7/2022 | |
| CN | 114698291 A | 7/2022 | |
| WO | 2021/112305 A1 | 6/2021 | |
| WO | 2021/117950 A1 | 6/2021 | |
| WO | 2021/206203 A1 | 10/2021 | |

* cited by examiner

DISPLAY DEVICE INCLUDING SLIDE SUPPORT ASSEMBLY

CROSS-REFERENCE TO RELATED APPLICATION

This application is a U.S. national stage of international application No. PCT/CN2022/128321, filed on Oct. 28, 2022, the disclosure of which is incorporated herein by reference in its entirety.

TECHNICAL FIELD

The present disclosure relates to the field of display technologies, and in particular, relates to a display device.

BACKGROUND

At present, a flexible display panel is used as a display screen of a display device, and the flexible display panel has advantages of a deformable property, a bendable property, and a great flexibility over the traditional display panel.

SUMMARY

Embodiments of the present disclosure provide a device. The technical solutions are as follows.

In some embodiments of the present disclosure, a display device is provided. The display device includes:

a flexible display panel, including a planar display portion, a rollable display portion, and a non-display fixed portion, wherein the rollable display portion is disposed between the planar display portion and the non-display fixed portion;

a first housing, fixedly connected to the planar display portion;

a second housing, slidably connected to the first housing and including a support housing and a rear cover fixedly connected to the support housing;

a reel, wherein both ends of the reel are connected to a side, facing away from the first housing, of the support housing, and the rollable display portion is wound over the reel;

a connecting plate, disposed between the support housing and the rear cover and fixedly connected to the non-display fixed portion;

a tension assembly, connected to the first housing and the connecting plate, and configured to apply a tension force to the flexible display panel via the connecting plate; and a slide support assembly, disposed between the connecting plate and the rear cover, wherein one side of the slide support assembly is connected to the connecting plate, and the other side of the slide support assembly is in contact with the rear cover, and the connecting plate is slidably connected to the rear cover via the slide support assembly.

In some embodiments, the slide support assembly includes at least one set of rolling members, each of the at least one set of rolling members including at least one rolling member, wherein the at least one rolling member is movably connected to the connecting plate and in contact with the rear cover.

In some embodiments, the slide support assembly includes one set of rolling members in a central region of the connecting plate; or the slide support assembly includes a plurality of sets of rolling members, an arrangement direction of the plurality of sets of rolling members being parallel to an axial direction of the reel, and the plurality of sets of rolling members being equally spaced.

In some embodiments, at least one first mount groove is defined in a side, proximal to the rear cover, of the connecting plate, wherein the at least one first mount groove is in one-to-one correspondence to the at least one set of rolling members, wherein some of rolling members in each of the at least one set of rolling members are disposed in the corresponding first mount groove, and some of rolling members in each of the at least one set of rolling members are disposed beyond the first mount groove and in contact with the rear cover.

In some embodiments, the rolling members are metal balls, and the display device further includes at least one magnet secured to a side, facing away from the rear cover, of the connecting plate and in one-to-one correspondence to the at least one set of rolling members, wherein the at least one magnet is configured to apply an attachment force to the rolling members in the corresponding set of rolling members.

In some embodiments, at least one second mount groove is defined in the side, facing away from the rear cover, of the connecting plate, wherein the at least one second mount groove is in one-to-one correspondence to the at least one magnet, and the at least one magnet is secured in the corresponding second mount groove.

In some embodiments, the tension assembly includes a guide shaft and a tension belt; wherein the guide shaft is connected to the second housing, an axial direction of the guide shaft is parallel to an axial direction of the reel, and the connecting plate is disposed between the guide shaft and the reel in a slide direction of the second housing relative to the first housing; and a first end of the tension belt is fixedly connected to the connecting plate, a second end of the tension belt is fixedly connected to the first housing upon bypassing the guide shaft, and the tension belt is slidably connected to the guide shaft.

In some embodiments, the second housing further includes a push rod, wherein a lengthwise direction of the push rod is parallel to the slide direction of the second housing relative to the first housing, and one end of the push rod is fixedly connected to the side, facing away from the first housing, of the support housing, and the other end of the push rod is connected to the guide shaft.

In some embodiments, the connecting plate is provided with at least one set of guide pillars, wherein each of the at least one set of guide pillars includes two opposite guide pillars, and the push rod is disposed between the two opposite guide pillars and slidably connected to the two opposite guide pillars.

In some embodiments, the guide pillar includes a guide pillar body and a limit ring sleeved on the guide pillar body and movably connected to the guide pillar body, wherein the limit ring is in contact with the push rod.

In some embodiments, the display device further includes: a first guide rail and a first slide block that are disposed between the connecting plate and the push rod, wherein the first guide rail is connected to the push rod, the first slide block is connected to the connecting plate, and the first guide rail is slidably connected to the first slide block.

In some embodiments, at least one of the first guide rail and the first slide block is magnetic, and the first guide rail is magnetically connected to the first slide block.

In some embodiments, the first guide rail is a magnetic strip with a lengthwise direction being parallel to the lengthwise direction of the push rod, and the first slide block is a magnetic sheet with opposite magnetism to the magnetic strip.

In some embodiments, the tension belt includes a first portion fixedly connected to the connecting plate and a second portion connected to a side, facing away from the connecting plate, of the first portion, wherein the second portion is fixedly connected to the first housing upon bypassing the guide shaft, and a width of the first portion is greater than a width of the second portion in a direction parallel to a lengthwise direction of the connecting plate.

In some embodiments, a third mount groove is defined in a side, proximal to the rear cover, of the connecting plate, wherein the first portion is secured in the third mount groove, and a face, proximal to the rear cover, of the first portion is flush with the face, proximal to the rear cover, of the connecting plate.

In some embodiments, the connecting plate includes a first connecting sub-plate and a second connecting sub-plate that are connected to each other; wherein the first connecting sub-plate is connected to the tension assembly, and the slide support assembly is disposed between the first connecting sub-plate and the rear cover; and the second connecting sub-plate is provided with a plurality of fixed protrusions arranged parallel to an axial direction of the reel, and the non-display fixed portion is provided with a plurality of fixed holes in one-to-one correspondence to the plurality of fixed protrusions, wherein the plurality of fixed holes are sleeved on the corresponding fixed protrusions and are fixedly connected to the corresponding fixed protrusions.

In some embodiments, the display device further includes: a second guide rail and a second slide block, wherein the second guide rail is fixed on the first housing, a lengthwise direction of the second guide rail is parallel to a slide direction of the second housing relative to the first housing, and the second slide block is fixedly connected to the second housing, sleeved on the second guide rail, and slidably connected to the second guide rail.

In some embodiments, the support housing is provided with a plurality of guide bars arranged in parallel, wherein a lengthwise direction of the plurality of guide bars is perpendicular to an axial direction of the reel; and the first housing is provided with a plurality of guide chutes in one-to-one correspondence to the plurality of guide bars, wherein at least part of the plurality of guide bars are disposed in the corresponding guide chutes and are slidably connected to the corresponding guide chutes.

In some embodiments, the first housing is further provided with a plurality of guide protrusions, wherein an arrangement direction of the plurality of guide protrusions is parallel to an arrangement direction of the plurality of guide bars, any two adjacent guide protrusions are configured to limit one of the plurality of guide chutes, the guide bar is disposed between two adjacent guide protrusions, and a face, proximal to the planar display portion, of the guide bar is flush with a face, proximal to the planar display portion, of the guide protrusion.

In some embodiments, the display device further includes: a driving assembly, wherein the driving assembly is connected to the first housing and the second housing, and configured to drive the second housing to slide relative to the first housing.

BRIEF DESCRIPTION OF DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

Clear embodiments of the present disclosure are shown by the above accompanying drawings, and more detailed descriptions are shown hereinafter. The accompanying drawings and texts are not intended to limit the scope of the scope of the concept of the present disclosure in any way, but to describe the concept of the present disclosure for those skilled in the art with reference to specific embodiments.

DETAILED DESCRIPTION

To make the objectives, technical solutions, and advantages of the present disclosure clearer, the embodiments of the present disclosure are further described in detail hereinafter with reference to the accompanying drawings.

In some practices, the display device generally includes a reel and a flexible display panel. The reel itself can rotates, and the flexible display panel can be unrolled and rolled with the reel, such that the display device has an unrolling state and a rolling state. Thus, a size adjustment function of a display face of the display device is achieved.

However, the flexible display panel is prone to a poor phenomenon of failure of normal rolling due to a poor hardness of the flexible display panel in the above display device, such that the flexible display panel is prone to damage, and a service life of the display device is less.

Figures 1, 2:
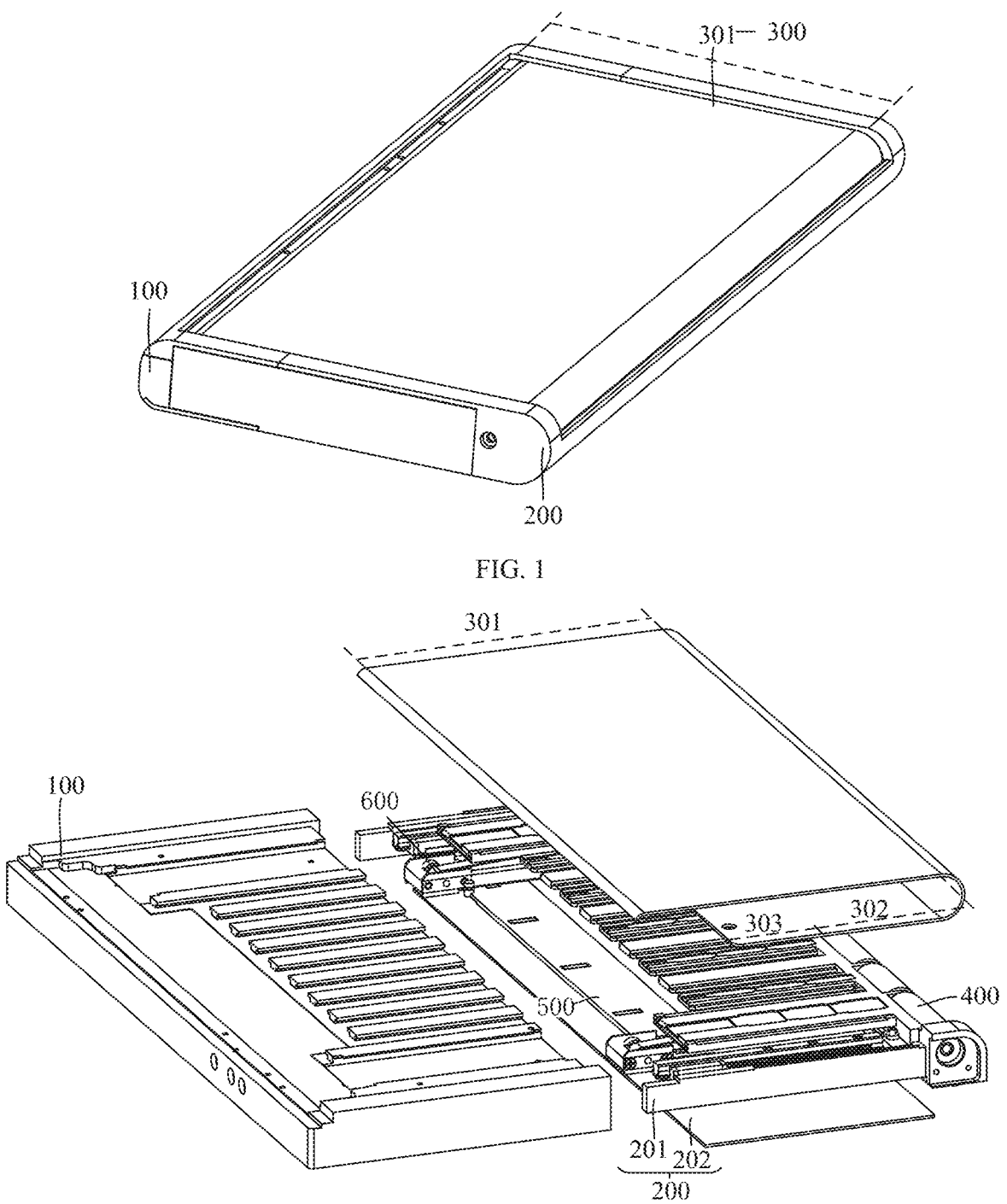
FIG. 1 is a schematic structural view of a display device according to some embodiments of the present disclosure.
FIG. 2 is an exploded view of the display device shown in FIG. 1.
Figure 3:
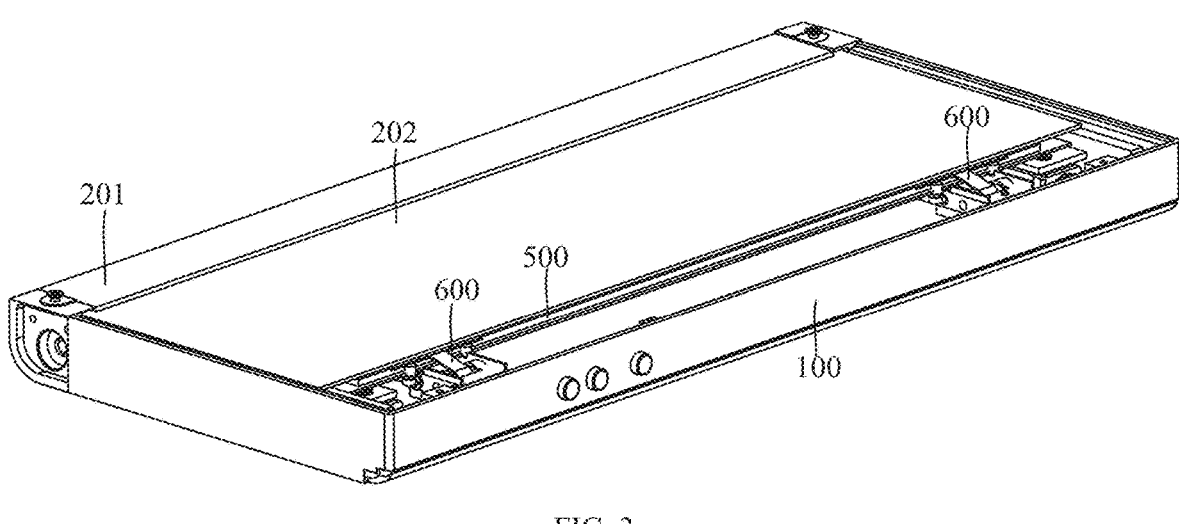
FIG. 3 is a schematic structural view taken at another perspective of the display device shown in FIG. 1.
Figure 4:
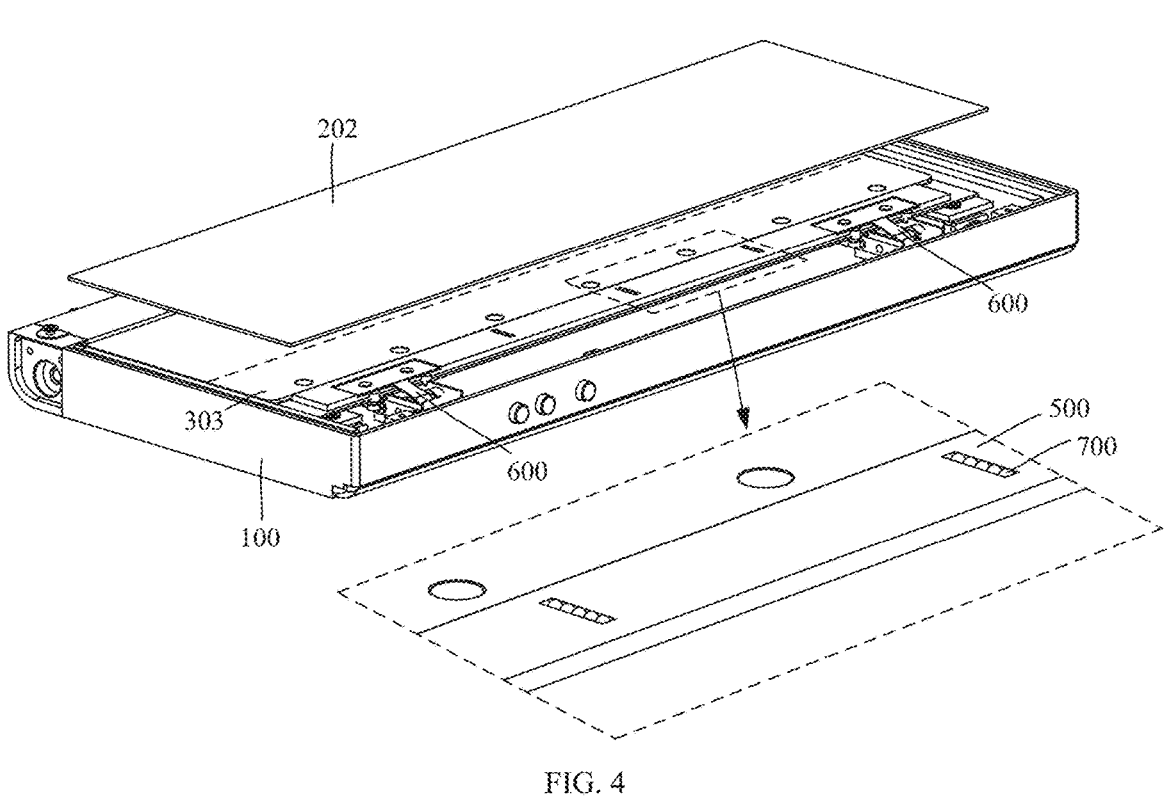
FIG. 4 is an exploded view of the display device shown in FIG. 3.

Referring to FIG. 1, FIG. 1 is a schematic structural view of a display device according to some embodiments of the present disclosure. For a clear view of the structure of the display device, referring to FIG. 2, FIG. 3, and FIG. 4, FIG. 2 is an exploded view of the display device shown in FIG. 1, FIG. 3 is a schematic structural view taken at another perspective of the display device shown in FIG. 1, and FIG. 4 is an exploded view of the display device shown in FIG. 3. The display device is any product or assembly with a display and sliding rolling function, such as a mobile phone, a tablet computer, a television, a display, a laptop computer, a digital photo frame, and a navigator. The display device includes a first housing 100, a second housing 200, a flexible display panel 300, a reel 400, a connecting plate 500, a tension assembly 600, and a slide support assembly 700.

The second housing 200 in the display device is disposed on a side of the first housing 100 and slidably connected to the first housing 100, and includes a support housing 201 and a rear cover 202 fixedly connected to the support housing 201.

The flexible display panel 300 includes a planar display portion 301, a rollable display portion 302, and a non-display fixed portion 303. The rollable display portion 302 in the flexible display panel 300 is disposed between the planar display portion 301 and the non-display fixed portion 303, and the planar display portion 301 in the flexible display panel 300 is fixedly connected to the first housing 100.

Both ends of the reel 400 in the display device are connected to a side, facing away from the first housing 100, of the support housing 201 in the second housing 200, and the rollable display portion 302 in the flexible display panel 300 is wound over the reel 400.

The connecting plate 500 in the display device is disposed between the support housing 201 and the rear cover 202 in the second housing 200, and fixedly connected to a side, facing away from the rollable display portion 302 in the flexible display panel 300, of the non-display fixed portion 303 in the flexible display panel 300.

The tension assembly 600 in the display device is connected to the first housing 100 and the connecting plate 500, and configured to apply a tension force to the flexible display panel 300 via the connecting plate 500.

The slide support assembly 700 in the display device is disposed between the connecting plate 500 and the rear cover 202 in the second housing 200. One side of the slide support assembly 700 is connected to the connecting plate 500, and the other side of the slide support assembly 700 is in contact with the rear cover 202 in the second housing 200, and the connecting plate 500 is slidably connected to the rear cover 202 in the second housing 200 via the slide support assembly 700.

Figure 5:
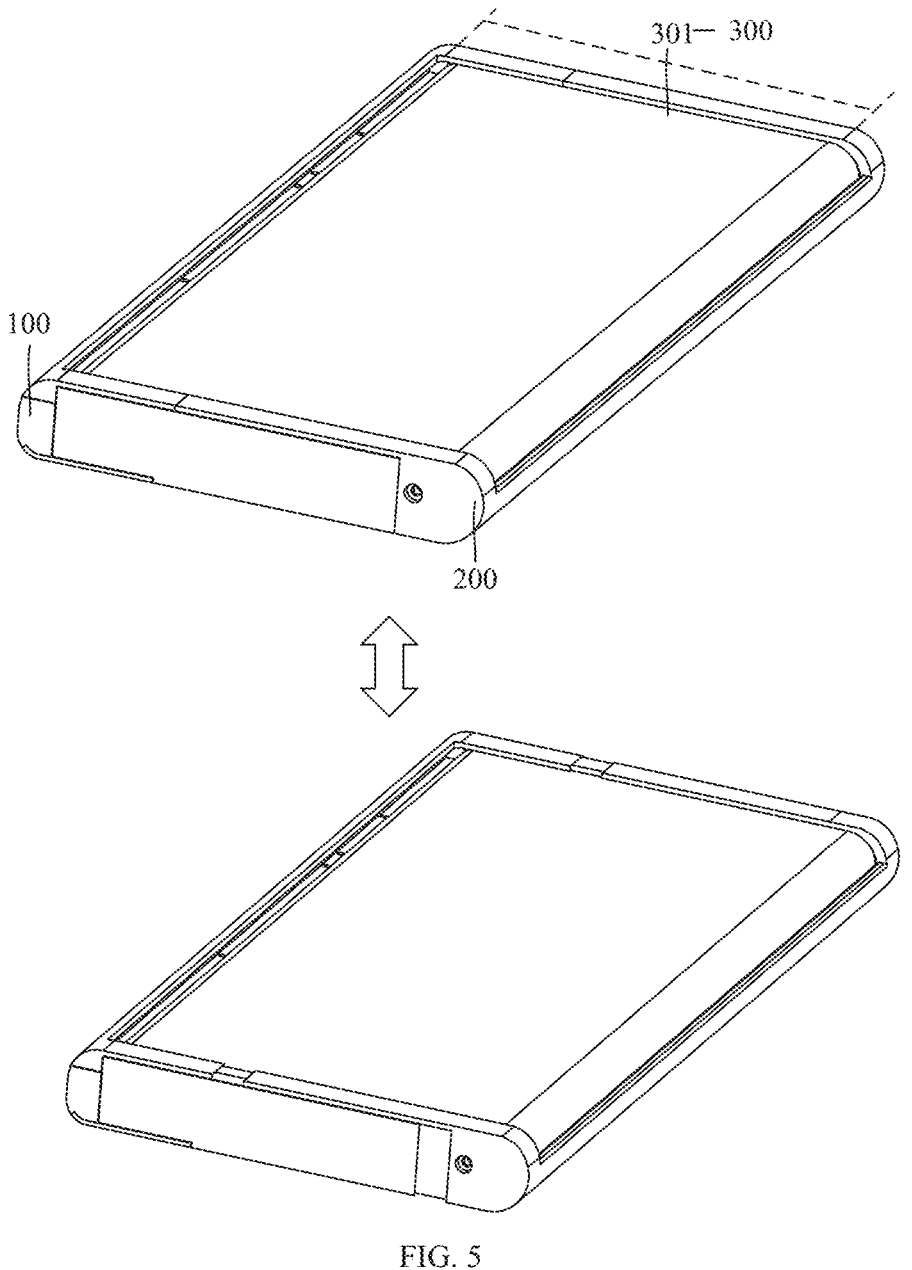
FIG. 5 is a schematic view of unrolling and rolling a flexible display panel in a display device according to some embodiments of the present disclosure.

Illustratively, the planar display portion 301 in the flexible display panel 300 is fixedly connected to the first housing 100, and the rollable display portion 302 and the non-display fixed portion 303 in the flexible display panel 300 are wound over the reel 400, such that the non-display fixed portion 303 is connected to the connecting plate 500. As such, referring to FIG. 5, FIG. 5 is a schematic view of unrolling and rolling a flexible display panel in a display device according to some embodiments of the present disclosure. In the case that the second housing 200 in the display device slides in a direction away from the first housing 100, the second housing 200 drives the rollable display portion 302 in the flexible display panel 300 to slide out from the second housing 200 under the action of the reel 400, such that a display face of the planar display portion 301 in the flexible display panel 300 and most of a display face of the rollable display portion 302 in the flexible display panel 300 are in a plane (that is, a size of a region in the flexible display panel for displaying screens is increased) and are configured to display screens. In the case that the second housing 200 in the display device slides in a direction close to the first housing 100, the second housing 200 drives the rollable display portion 302 in the flexible display panel 300 to slide into the second housing 200 under the action of the reel 400, such that the size of the region in the flexible display panel 300 for displaying screens is reduced, and the flexible display panel 300 is portable. It should be noted that the embodiments of the present disclosure are described by taking the first housing 100 being a fixed housing in a sliding rolling display device, and the second housing 200 being a movable housing in the sliding rolling display device as an example.

In the embodiments of the present disclosure, the tension assembly 600 is connected to the connecting plate 500 connected to the non-display fixed portion 303 in the flexible display panel 300 and the first housing 100. In the case that the second housing 200 slides relative to the first housing 100 to drive the flexible display panel 300 to be unrolled and rolled, the tension assembly 600 applies a tension force to the flexible display panel 300, such that a flatness of the flexible display panel 300 is improved. In addition, upon unrolling of the flexible display panel 300 with sliding of the second housing 200 in a direction away from the first housing 100, the flexible display panel 300 can be normally rolled with sliding of the second housing 200 in a direction close to the first housing 100, such that a risk of wrinkling and damaging the flexible display panel 300 is efficiently reduced, and a service life of the display device is efficiently prolonged. In addition, the slide support assembly 700 connected to the connecting plate 500 is disposed between the connecting plate 500 in the display device and the rear cover 202 in the second housing 200, such that the slide support assembly 700 is in contact with the rear cover 202 in the second housing 200, and the connecting plate 500 is slidably connected to the rear cover 202 in the second housing 200 via the slide support assembly 700. As such, the slide support assembly 700 connected to the connecting plate 500 is in contact with the rear cover 202 in the second housing 200 and slides relative to the rear cover 202 in the second housing 200 in the case that the second housing 200 slides relative to the first housing 100 and the connecting plate 500 connected to the non-display fixed portion 303 in the flexible display panel 300 slides relative to the rear cover 202 in the second housing 200. Thus, the poor direct contact of the non-display fixed portion 303 in the flexible display panel 300 with the rear cover 202 in the second housing 200 in upwarp of the non-display fixed portion 303 in the flexible display panel 300 is efficiently avoided, the possibility of scratch of the non-display fixed portion 303 in the flexible display panel 300 by the rear cover 202 in the second housing 200 is reduced, the frictional resistance between the non-display fixed portion 303 in the flexible display panel 300 and the rear cover 202 in the second housing 200 is reduced, and the user experience of the display device is efficiently improved.

In summary, a display device is provided in the embodiments of the present disclosure. The display device includes: a first housing, a second housing, a flexible display panel, a reel, a connecting plate, a tension assembly, and a slide support assembly. The tension assembly is connected to the connecting plate connected to the non-display fixed portion in the flexible display panel and the first housing. In the case that the second housing slides relative to the first housing to drive the flexible display panel to be unrolled and rolled, the tension assembly applies a tension force to the flexible display panel, such that a flatness of the flexible display panel is improved. In addition, upon unrolling of the flexible display panel with sliding of the second housing in a direction away from the first housing, the flexible display panel can be normally rolled with sliding of the second housing in a direction close to the first housing, such that a risk of wrinkling and damaging the flexible display panel is efficiently reduced, and a service life of the display device is efficiently prolonged. In addition, the slide support assembly connected to the connecting plate is disposed between the connecting plate in the display device and the rear cover in the second housing, such that the slide support assembly is in contact with the rear cover in the second housing, and the connecting plate is slidably connected to the rear cover in the second housing via the slide support assembly. As such, the slide support assembly connected to the connecting plate is in contact with the rear cover in the second housing and slides relative to the rear cover in the second housing in the case that the second housing slides relative to the first housing and the connecting plate connected to the non-display fixed portion in the flexible display panel slides relative to the rear cover in the second housing. Thus, the poor direct contact of the non-display fixed portion in the flexible display panel with the rear cover in the second housing in upwarp of the non-display fixed portion in the flexible display panel is efficiently avoided, the possibility of scratch of the non-display fixed portion in the flexible display panel by the rear cover in the second housing is reduced, the frictional resistance between the non-display fixed portion in the flexible display panel and the rear cover in the second housing is reduced, and the user experience of the display device is efficiently improved.

Figure 6:
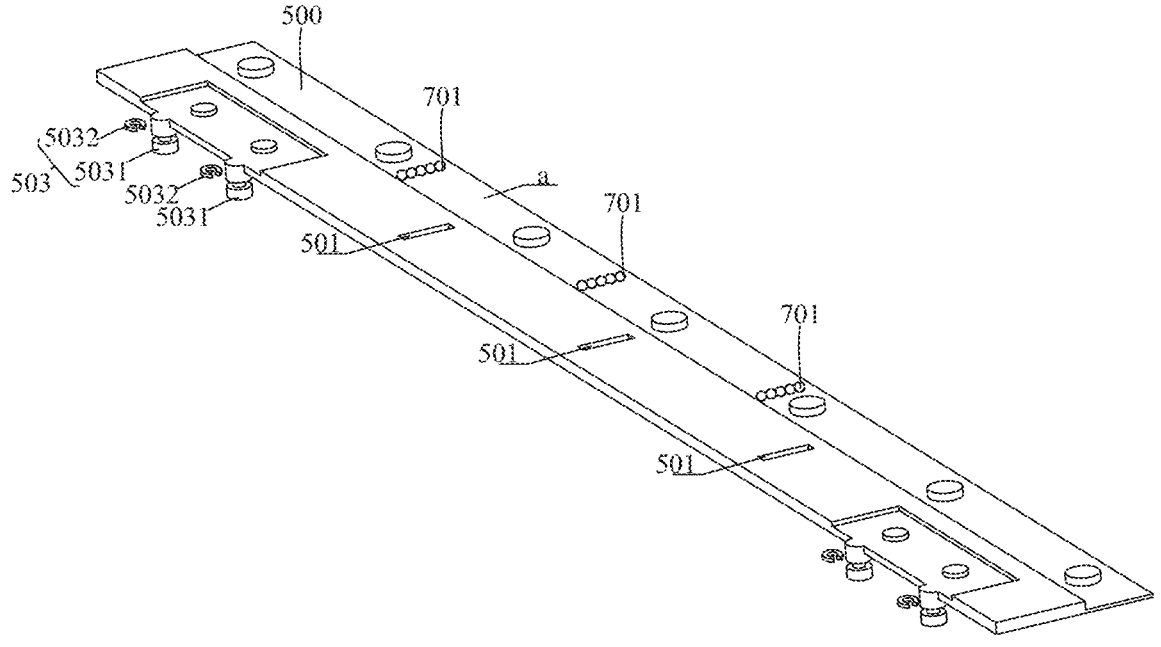
FIG. 6 is an exploded view of a slide support assembly and a connecting plate according to some embodiments of the present disclosure.
Figure 7:
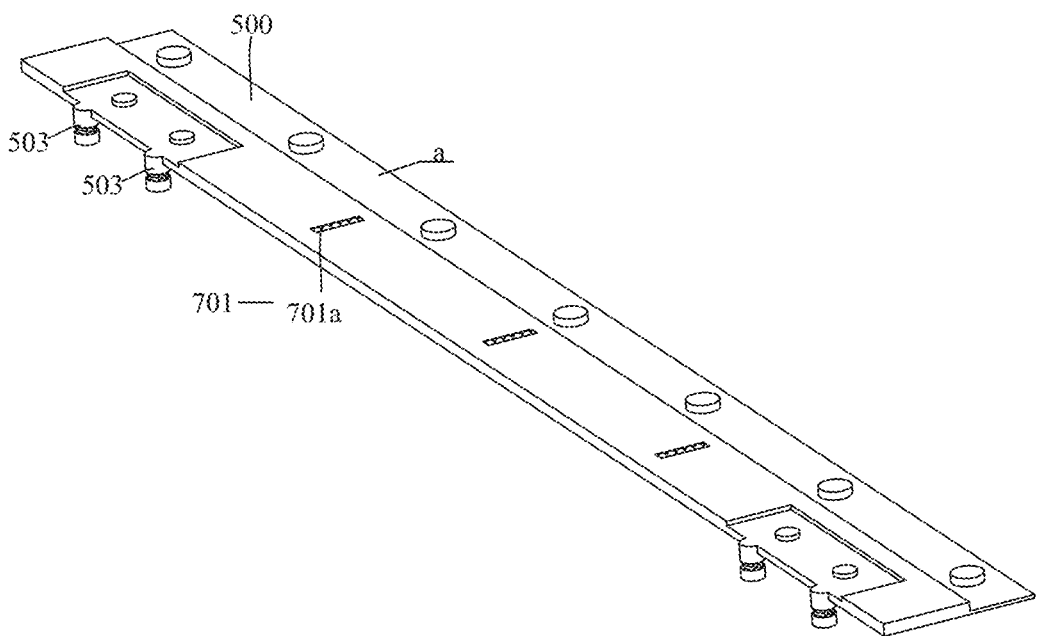
FIG. 7 is a schematic view of connection of the slide support assembly to the connecting plate shown in FIG. 6.

In some embodiments, referring to FIG. 4, FIG. 6, and FIG. 7, FIG. 6 is an exploded view of a slide support assembly and a connecting plate according to some embodiments of the present disclosure, and FIG. 7 is a schematic view of connection of the slide support assembly to the connecting plate shown in FIG. 6. The slide support assembly 700 in the display device includes at least one set of rolling members. One set of rolling members includes at least one rolling member 701, and the rolling member 701 in the slide support assembly 700 is movably connected to the connecting plate 500 and in contact with the rear cover 202 in the second housing 200. In this case, as at least one set of rolling members including at least one rolling member 701 is disposed in the slide support assembly 700, and the rolling member 701 is movably connected to the connecting plate 500 and in contact with the rear cover 202 in the second housing 200, the connecting plate 500 moves on the rear cover 202 in the second housing 200 via the rolling member 701 in the case that the second housing 200 slides relative to the first housing 100 and the connecting plate 500 connected to the non-display fixed portion 303 in the flexible display panel 300 slides relative to the rear cover 202 in the second housing 200. That is, the rolling member 701 supports the connecting plate 500, the frictional resistance on the connecting plate 500 in sliding on the rear cover 202 in the second housing 200 is less, and the connecting plate 500 connected to the non-display fixed portion 303 in the flexible display panel 300 slides smoothly. Illustratively, one set of rolling members includes one or more rolling members 701, which is not limited in the embodiments of the present disclosure.

In the embodiments of the present disclosure, the slide support assembly 700 between the connecting plate 500 and the rear cover 202 in the second housing 200 is implemented in many manners, and the following embodiments of the present disclosure are described in two optional implementations.

In a first optional implementation, the slide support assembly 700 includes one set of rolling members, and the rolling members 701 in the one set of rolling members are disposed in a central region of the connecting plate 500. In the case that the slide support assembly 700 includes one set of rolling members, the one set of rolling members is disposed in the central region of the connecting plate 500. As such, the one set of rolling members in the central region of the connecting plate 500 ensures that the connecting plate 500 connected to the non-display fixed portion 303 in the flexible display panel 300 slides smoothly, and the possibility of the poor phenomenon of tilt of the connecting plate 500 in sliding is less.

In a second optional implementation, as shown in FIG. 6 and FIG. 7, the slide support assembly 700 includes a plurality of sets of rolling members 701, an arrangement direction of the plurality of sets of rolling members 701 is parallel to an axial direction of the reel 400, and the plurality of sets of rolling members are equally spaced on the connecting plate 500. In the case that the slide support assembly 700 includes the plurality of sets of rolling members 701 equally spaced on the connecting plate 500, the plurality of sets of rolling members ensure that the connecting plate 500 connected to the non-display fixed portion 303 in the flexible display panel 300 slides smoothly, and a force on the connecting plate 500 applied by the equally spaced plurality of sets of rolling members 701 is uniform, such that the poor phenomenon of tilt of the connecting plate 500 in sliding is avoided. Illustratively, two or three or more sets of rolling members 701 are defined, which is not limited in the embodiments of the present disclosure.

In some embodiment, as shown in FIG. 6 and FIG. 7, at least one first mount groove 501 is defined in a side a, proximal to the rear cover 202 in the second housing 200, of the connecting plate 500 in the display device, and the at least one first mount groove 501 is in one-to-one correspondence to the at least one set of rolling members 701 in the slide support assembly 700. Some of rolling members 701 in one set of rolling members 701 are disposed in the corresponding first mount groove 501 in the connecting plate 500, and some of rolling members 701 in one set of rolling members 701 are disposed beyond the first mount groove 501 and in contact with the rear cover 202 in the second housing 200. In this case, as the first mount groove 501 is disposed in the side, proximal to the rear cover 202 in the second housing 200, of the connecting plate 500, and one set of rolling members 701 are disposed in the first mount groove 501, a stability of connection between each set of rolling members 701 and the connecting plate 500 is ensured. Illustratively, in the case that the rolling members 701 in one set of rolling members 701 are arranged in a direction parallel to a slide direction of the second housing 200 relative to the first housing 100, a lengthwise direction of the first mount groove 501 is parallel to the slide direction of the second housing 200 relative to the first housing 100.

Figure 8:
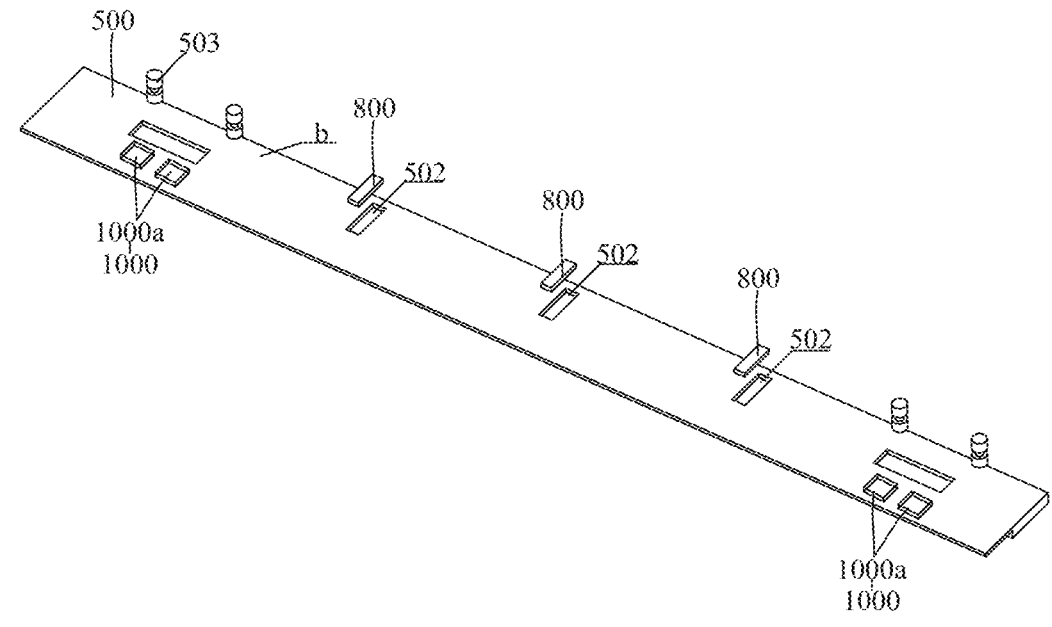
FIG. 8 is an exploded view of another slide support assembly and another connecting plate according to some embodiments of the present disclosure.
Figure 9:
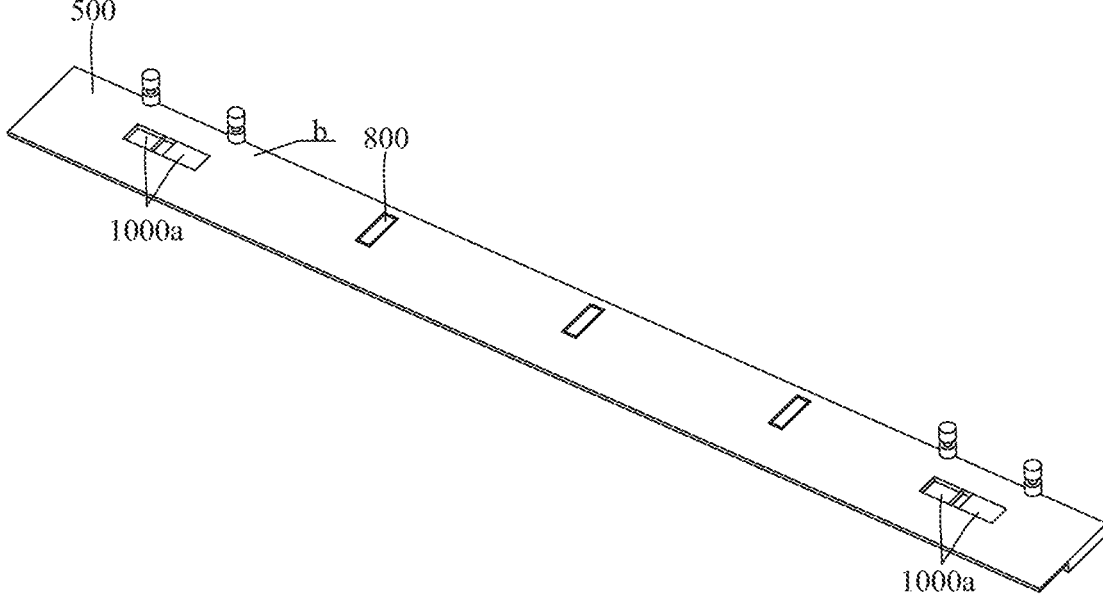
FIG. 9 is a schematic view of connection of the slide support assembly to the connecting plate shown in FIG. 8.

In the embodiments of the present disclosure, referring to FIG. 7, FIG. 8, and FIG. 9, FIG. 8 is an exploded view of another slide support assembly and another connecting plate according to some embodiments of the present disclosure, and FIG. 9 is a schematic view of connection of the slide support assembly to the connecting plate shown in FIG. 8. The rolling member 701 in the slide support assembly 700 is a metal ball 701*a*, and the display device further includes at least one magnet 800 secured to a side b, facing away from the rear cover 202 in the second housing 200, of the connecting plate 500 and in one-to-one correspondence to the at least one set of rolling members 701. The magnet 800 is configured to apply an attachment force to the rolling members 701 in the corresponding set of rolling members. In this case, as the magnet 800 is disposed on the side b, facing away from the rear cover 202 in the second housing 200, of the connecting plate 500, and the magnet 800 applies the attachment force to the rolling members 701, the stability of connection between the rolling member 701 and the connecting plate 500 is ensured. In some embodiments, the rolling member 701 in the slide support assembly 700 is a rolling wheel movably connected to the connecting plate 500, and the rolling wheel is slidably connected to the rear cover 202 in the second housing 200, which is not limited in the embodiments of the present disclosure.

In some embodiments, as shown in FIG. 8 and FIG. 9, at least one second mount groove 502 is defined in the side b, facing away from the rear cover 202 in the second housing 200, of the connecting plate 500, the at least one second mount groove 502 is in one-to-one correspondence to the at least one magnet 800, and the magnet 800 in the display device is secured in the corresponding second mount groove 502. In this case, as the second mount groove 502 is defined in the side b, facing away from the rear cover 202 in the second housing 200, of the connecting plate 500, and the magnet 800 is secured in the second mount groove 502, the distance between the magnet 800 and the rolling member 701 is further reduced, and the reliability of attaching the rolling member 701 by the magnet 800 is ensured. In the present disclosure, as shown in FIG. 6, FIG. 7, FIG. 8, and FIG. 9, at least one first mount groove 501 and at least one second mount groove 502 in the connecting plate 500 are in one-to-one correspondence, and an orthogonal projection of the first mount groove 501 on a plane of the connecting plate 500 is within an orthogonal projection of the second mount groove 502 on the plane of the connecting plate 500. In this case, as the orthogonal projection of the first mount groove 501 on the plane of the connecting plate 500 is within the orthogonal projection of the second mount groove 502 on the plane of the connecting plate 500, the reliability of attaching the rolling member 701 by the magnet 800 is further ensured, and the use reliability of the display device is further ensured.

Figure 10:
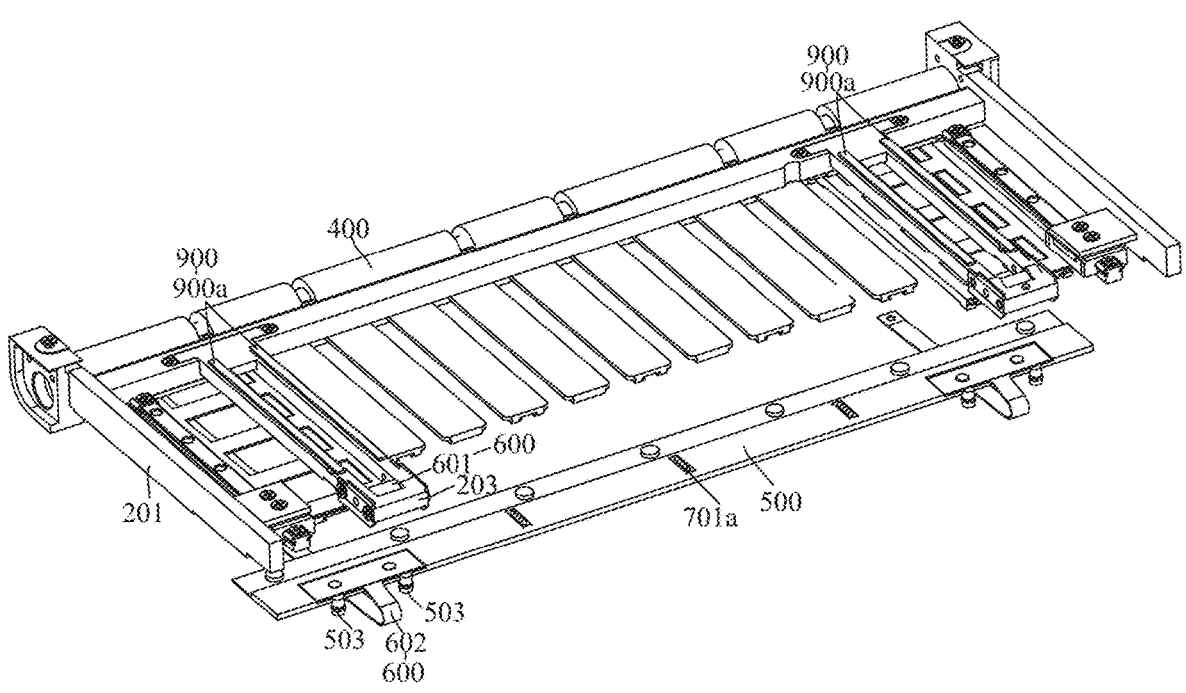
FIG. 10 is an exploded view of partial structure of a display device according to some embodiments of the present disclosure.
Figure 11:
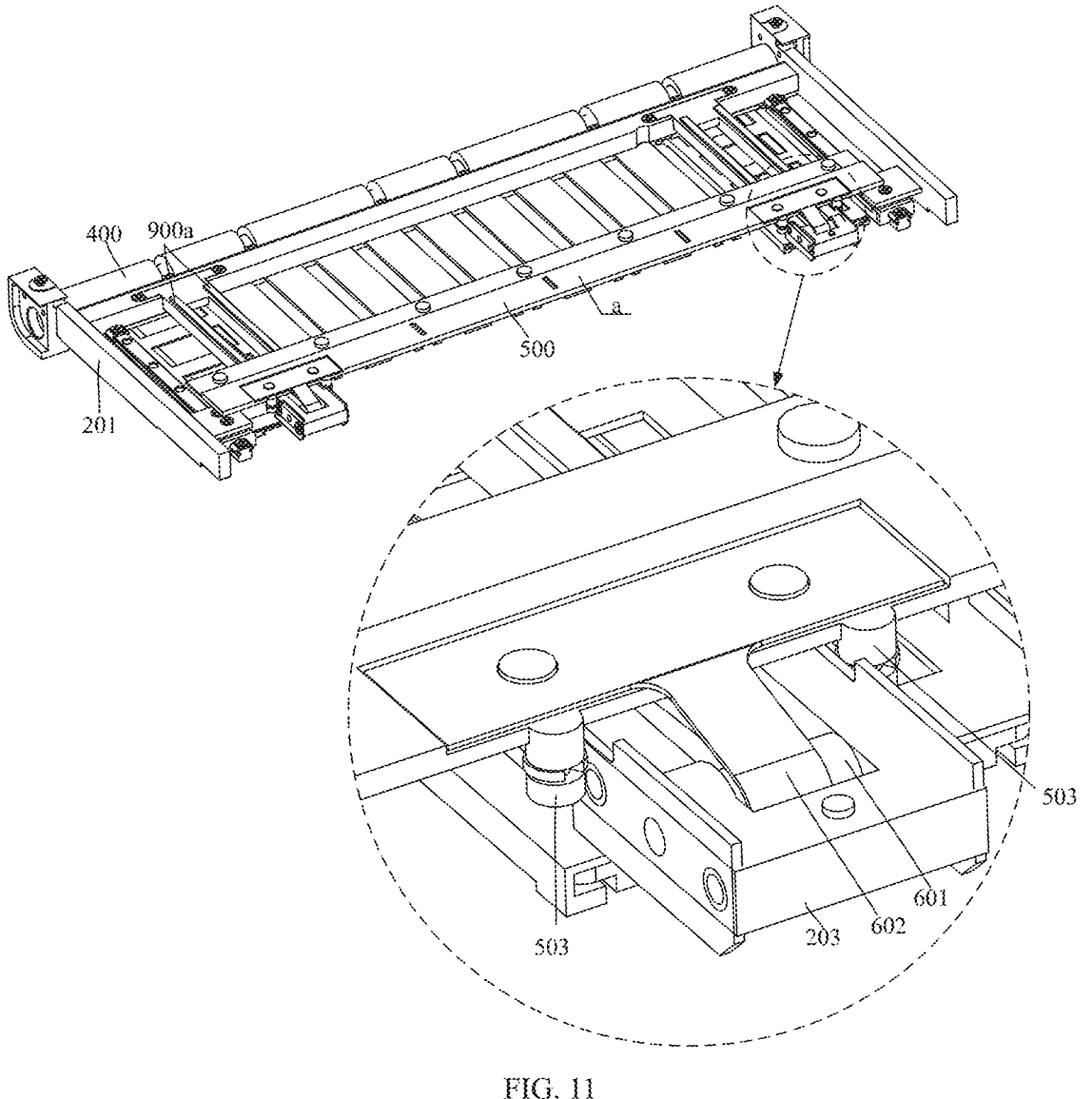
FIG. 11 is a schematic view of an assembly of the partial structure of the display device shown in FIG. 10.

In the embodiments of the present disclosure, referring to FIG. 10 and FIG. 11, FIG. 10 is an exploded view of partial structure of a display device according to some embodiments of the present disclosure, and FIG. 11 is a schematic diagram of an assembly of the partial structure of the display device shown in FIG. 10. The tension assembly 600 in the display device includes a guide shaft 601 and a tension belt 602. The guide shaft 601 in the tension assembly 600 is connected to the second housing 200, an axial direction of the guide shaft 601 is parallel to an axial direction of the reel 400, and the connecting plate 500 is disposed between the guide shaft 601 and the reel 400 in a slide direction of the second housing 200 relative to the first housing 100. A first end of the tension belt 602 in the tension assembly 600 is fixedly connected to the connecting plate 500, a second end of the tension belt 602 is fixedly connected to the first housing 100 upon bypassing the guide shaft 601, and the tension belt 602 is slidably connected to the guide shaft 601. In this case, as the connecting plate 500 connected to the non-display fixed portion 303 in the flexible display panel 300 is disposed between the guide shaft 601 and the reel 400, one end of the tension belt 602 is connected to the connecting plate 500, and the other end of the tension belt 602 is fixedly connected to the first housing 100 upon bypassing the guide shaft 601, the tension belt 602 applies a pull force to the flexible display panel 300 via the connecting plate 500, such that the flatness of the flexible display panel 300 is ensured, and the poor phenomenon of wrinkles in the flexible display panel 300 due to loose enough is avoided. Illustratively, the tension belt 602 in the tension assembly 600 is a plastic strip or a metal strip, which is not limited in the embodiments of the present disclosure.

In some embodiments, as shown in FIG. 10 and FIG. 11, the second housing 200 in the display device further includes a push rod 203. A lengthwise direction of the push rod 203 is parallel to the slide direction of the second housing 200 relative to the first housing 100, one end of the push rod 203 is fixedly connected to the side, facing away from the first housing 100, of the support housing 201 in the second housing 200, and the other end of the push rod 203 is connected to the guide shaft 601 in the tension assembly 600. In this case, as the push rod 203 is fixedly connected to the support housing 201 in the second housing 200, and the guide shaft 601 in the tension assembly 600 is disposed on the end, proximal to the first housing 100, of the push rod 203, the push rod 203 supports the guide shaft 601 in the tension assembly 600 to ensure that the guide shaft 601 in the tension assembly 600 is not moved. Illustratively, the guide shaft 601 in the tension assembly 600 is rotatably connected to the end portion of the push rod 203, such that the friction force is present between the tension belt 602 and the guide shaft 601 in unrolling or rolling the flexible display panel 300 in the case that the tension belt 602 is fixedly connected to the first housing 100 upon bypassing the guide shaft 601. As the guide shaft 601 is rotatably connected to the end portion of the push rod 203, the friction force between the tension belt 602 and the guide shaft 601 is a sliding friction force. Thus, the tension belt 602 is prone to sliding by reducing the friction force between the tension belt 602 and the guide shaft. Illustratively, two sets of tension assemblies 600 are defined, and an arrangement direction of the two sets of tension assemblies 600 is parallel to the axial direction of the reel 400. Two push rods 203 are correspondingly disposed, and an arrangement direction of the two push rods 203 is also parallel to the axial direction of the reel 400.

In the embodiments of the present disclosure, as shown in FIG. 6, FIG. 7, FIG. 10, and FIG. 11, the connecting plate 500 in the display device is provided with at least one set of guide pillars. One set of guide pillars includes two opposite guide pillars 503, and the push rod 203 in the second housing 00 is disposed between the two opposite guide pillars 503 and slidably connected to the two opposite guide pillars 503. In this case, as at least one set of guide pillars 503 are disposed in the connecting plate 500, each set of guide pillars includes two opposite guide pillars 503, and the push rod 203 is disposed between the two opposite guide pillars 503, a guide function and a limit function are present between the two opposite guide pillars 503 and the push rod 203 in relative sliding of the second housing 200 and the first housing 100. That is, a moving direction of the connecting plate 500 is limited by the push rod 203 in moving of the connecting plate 500, such that the moving direction of the connecting plate 500 is parallel to the slide direction of the second housing 200 relative to the first housing 100 as possible, and the poor phenomenon of tilt of the non-display fixed portion 303 in the flexible display panel 300 in moving is avoided. Illustratively, each push rod 203 corresponds to one or more sets of guide pillars 503, and the following embodiments of the present disclosure are described by taking each push rod 203 corresponding to one set of guide pillars 503 as an example.

In the embodiments of the present disclosure, as shown in FIG. 6, FIG. 7, FIG. 10, and FIG. 11, the guide pillar 503 in the connecting plate 500 includes a guide pillar body 5031 and a limit ring 5032 sleeved on the guide pillar body 5031 and movably connected to the guide pillar body 5031. The limit ring 5032 is in contact with the push rod 203. In this case, as the limit ring 5032 is disposed on the guide pillar body 5031, and the guide pillar body 5031 is movably connected to the guide pillar body 5031, the friction force between the push rod 203 and the limit ring 5032 is a rolling friction force in the case that the push rod 203 is in contact with the limit ring 5032 on the guide pillar body 5031 in moving, and the friction force between the push rod 203 and the guide pillar 503 is reduced. That is, the limit ring 5032 limits the moving direction of the push rod 203, and ensures sliding between the push rod 203 and the guide pillar 503.

In some embodiments, as shown in FIG. 8, FIG. 9, FIG. 10, and FIG. 11, the display device further includes a first guide rail 900 and a first slide block 1000 that are disposed between the connecting plate 500 and the push rod 203. The first guide rail 900 is connected to the push rod 203, the first slide block 1000 is connected to the connecting plate 500, and the first guide rail 900 is slidably connected to the first slide block 1000. In this case, as the first guide rail 900 is connected to the push rod 203, the first slide block 1000 is connected to the connecting plate 500, and the first guide rail 900 is slidably connected to the first slide block 1000, based on the fit of the first slide block 1000 with the first guide rail 900, the connecting plate 500 slides relative to the push rod 203, and the moving of the connecting plate 500 in a direction close to the rear cover 202 in the second housing 200 under the driving of the non-display fixed portion 303 in the flexible display panel 300 is avoided. That is, the upwarp of the non-display fixed portion 303 in the flexible display panel 300 is efficiently avoided, and the friction force between the connecting plate 500 and the rear cover 202 in the second housing 200 is not increased.

In the embodiments of the present disclosure, at least one of the first guide rail 900 and the first slide block 1000 between the connecting plate 500 and the push rod 203 is magnetic, and the first guide rail 900 is magnetically connected to the first slide block 1000. In this case, as the at least one of the first guide rail 900 and the first slide block 1000 is magnetic, and the first guide rail 900 is magnetically connected to the first slide block 1000, the first guide rail 900 connected to the push rod 203 applies an attachment force to the first slide block 1000 connected to the connecting plate 500, such that the positive pressure on the rear cover 202 in the second housing 200 applied by the slide support assembly 700 connected to the connecting plate 500 is reduced. That is, the upwarp of the non-display fixed portion 303 in the flexible display panel 300 connected to the connecting plate 500 is limited, and the friction force between the connecting plate 500 and the rear cover 202 in the second housing 200 is reduced.

Figure 12:
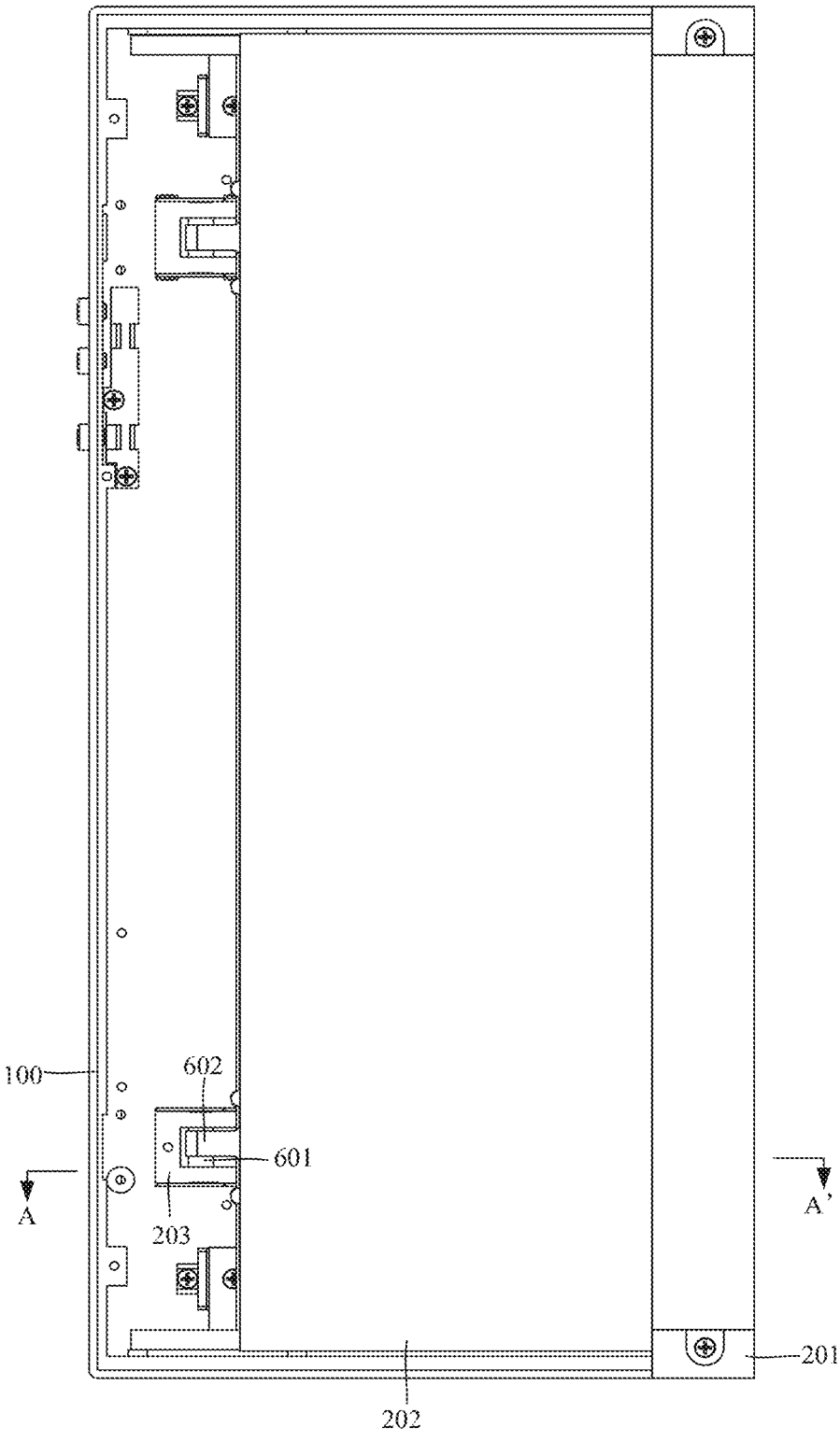
FIG. 12 is a rear view of a display device according to some embodiments of the present disclosure.
Figure 13:
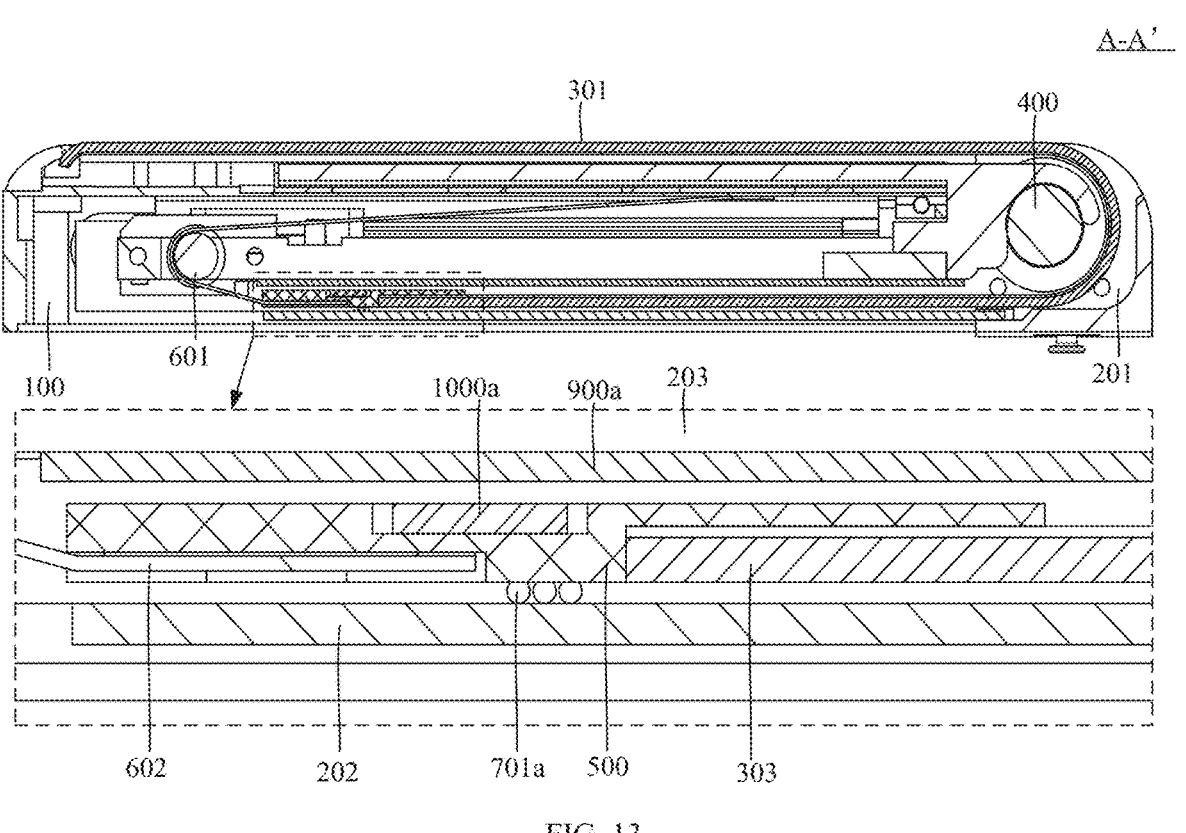
FIG. 13 is a sectional view taken at an A-A' position shown in FIG. 12.

In some embodiments, as shown in FIG. 6, FIG. 7, FIG. 10, FIG. 11, FIG. 12, and FIG. 13, FIG. 12 is a rear view of a display device according to some embodiments of the present disclosure, and FIG. 13 is a sectional view taken at an A-A' position shown in FIG. 12. The first guide rail 900 is a magnetic strip 900a with a lengthwise direction being parallel to the lengthwise direction of the push rod 203, and the first slide block 1000 is a magnetic sheet 1000a with opposite magnetism to the magnetic strip 900a. In this case, the positive pressure on the rear cover 202 in the second housing 200 applied by the slide support assembly 700 connected to the connecting plate 500 is reduced based on the attachment force between the magnetic sheet 1000a and the magnetic strip 900a with opposite magnetism. It should be noted that in some embodiments, the first guide rail 900 is a magnetic strip 900a with a lengthwise direction being parallel to the lengthwise direction of the push rod 203, the first slide block 1000 is a metal sheet (not shown in drawings), and the magnetic strip 900a applies an attachment force to the metal sheet.

Figure 14:
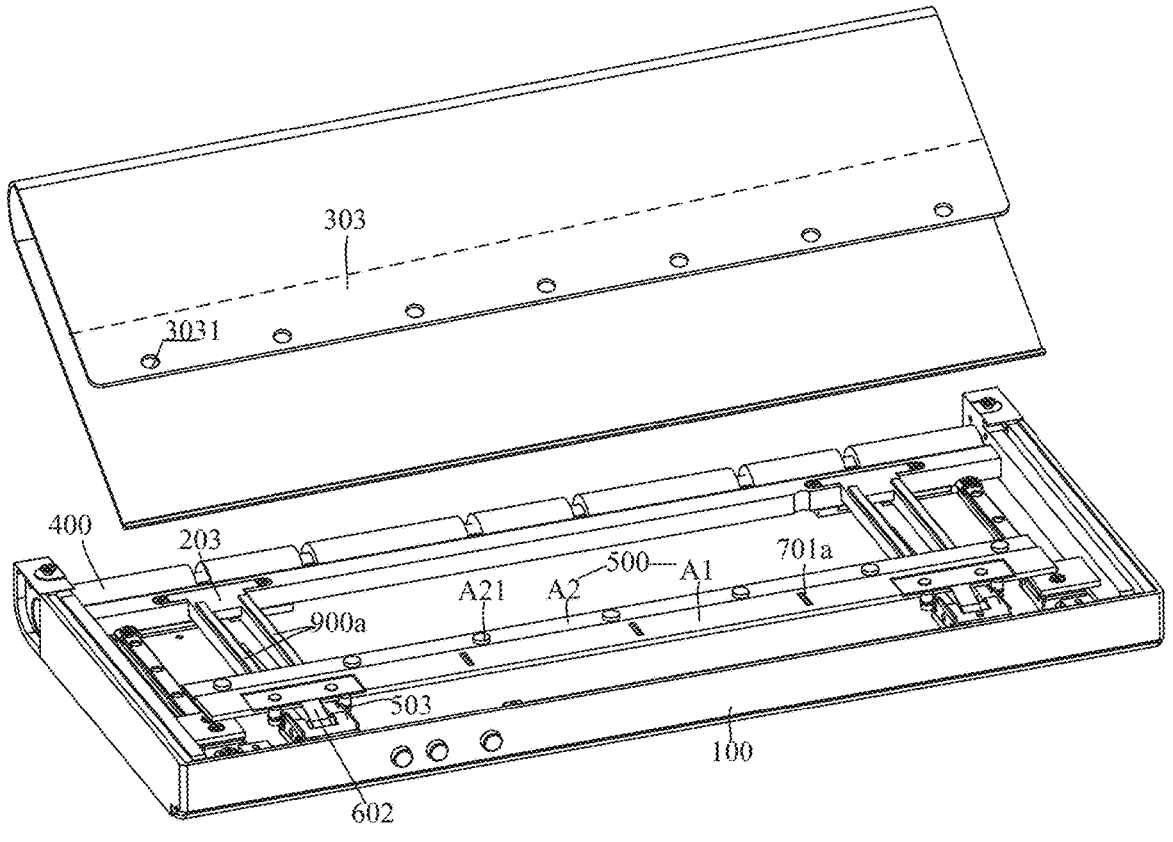
FIG. 14 is an exploded view of partial structure of another display device according to some embodiments of the present disclosure.
Figure 15:
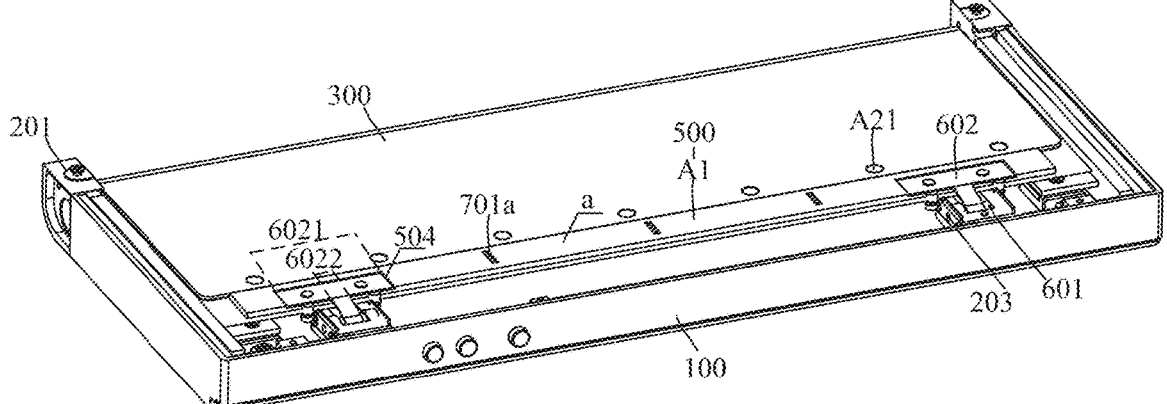
FIG. 15 is a schematic view of an assembly of the display device shown in FIG. 14.

In some embodiments of the present disclosure, referring to FIG. 14 and FIG. 15, FIG. 14 is an exploded view of partial structure of another display device according to some embodiments of the present disclosure, and FIG. 15 is a schematic view of an assembly of the display device shown in FIG. 14. The non-display fixed portion 303 in the flexible display panel 300 and the tension belt 602 both apply forces to the connecting plate 500. The tension belt 602 in the tension assembly 600 includes a first portion 6021 fixedly connected to the connecting plate 500 and a second portion 6022 connected to a side, facing away from the connecting plate 500, of the first portion 6021. The second portion 6022 is fixedly connected to the first housing 100 upon bypassing the guide shaft 601 in the tension assembly 600, and a width of the first portion 6021 in the tension belt 602 is greater than a width of the second portion 6022 in the tension belt 602 in a direction parallel to a lengthwise direction of the connecting plate 500. In this case, as the width of the first portion 6021 connected to the connecting plate 500 is greater than the width of the second portion 6022 connected to the first housing 100, the connection area of the tension belt 602 and the connecting plate 500 is efficiently increased, such that the connection of the tension belt 602 and the connecting plate 500 is stable in the case that the non-display fixed portion 303 in the flexible display panel 300 and the tension belt 602 both apply the forces to the connecting plate 500, and the poor phenomenon of separation of the tension belt 602 and the connecting plate 500 is avoided.

In some embodiments, as shown in FIG. 15, a third mount groove 504 is defined in a side a, proximal to the rear cover 202 in the second housing 200, of the connecting plate 500. The first portion 6021 in the tension belt 602 is secured in the third mount groove 504 in the connecting plate 500, and a face, proximal to the rear cover 202 in the second housing 200, of the first portion 6021 in the tension belt 602 is flush with the face a, proximal to the rear cover 202 in the second housing 200, of the connecting plate 500. In this case, as the third mount groove 504 is defined in the side, proximal to the rear cover 202 in the second housing 200, of the connecting plate 500, the first portion 6021 in the tension belt 602 is secured in the third mount groove 504, and the face, proximal to the rear cover 202 in the second housing 200, of the first portion 6021 is flush with the face, proximal to the rear cover 202 in the second housing 200, of the connecting plate 500, the fraction force is not present between the first portion 6021 in the tension belt 602 and the rear cover 202 in the second housing 200 in the case that the connecting plate 500 slides relative to the rear cover 202 in the second housing 200. That is, a smooth sliding of the connecting plate 500 relative to the rear cover 202 in the second housing 200 is ensured.

In some embodiments, as shown in FIG. 14 and FIG. 15, the connecting plate 500 in the display device includes a first connecting sub-plate A1 and a second connecting sub-plate A2 that are connected to each other. The first connecting sub-plate A1 is connected to the tension assembly 600, and the slide support assembly 700 is disposed between the first connecting sub-plate A1 and the rear cover 202 in the second housing 200. The second connecting sub-plate A2 is provided with a plurality of fixed protrusions A21 arranged parallel to an axial direction of the reel 400, and the non-display fixed portion 303 in the flexible display panel 300 is provided with a plurality of fixed holes 3031 in one-to-one correspondence to the plurality of fixed protrusions A21. The plurality of fixed holes 3031 are sleeved on the corresponding fixed protrusions A21 and are fixedly connected to the corresponding fixed protrusions A21. In this case, as the tension assembly 600 is connected to the first connecting sub-plate A1 in the connecting plate 500, the second connecting sub-plate A2 is provided with the plurality of fixed protrusions A21, and the non-display fixed portion 303 in the flexible display panel 300 connected to the second connecting sub-plate A2 is provided with the plurality of fixed holes 3031, the plurality of fixed holes 3031 are connected to the plurality of fixed protrusions A21 in one-to-one correspondence, such that the connection of the non-display fixed portion 303 in the flexible display panel 300 and the connecting plate 500 is stable in the case that the non-display fixed portion 303 in the flexible display panel 300 and the tension belt 602 both apply the forces to the connecting plate 500, and the poor phenomenon of separation of the flexible display panel 300 and the connecting plate 500 is avoided.

Figure 16:
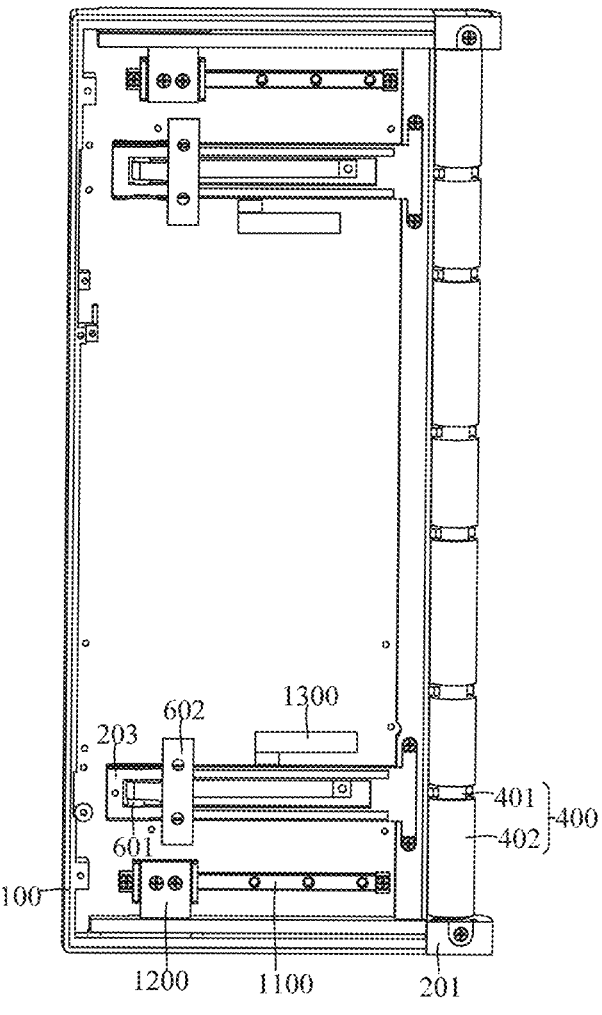
FIG. 16 is a schematic structural view of a display device according to some embodiments of the present disclosure.

In some embodiments, referring to FIG. 16, FIG. 16 is a schematic structural view of a display device according to some embodiments of the present disclosure. The display device further includes a second guide rail 1100 and a second slide block 1200. The second guide rail 1100 is fixed on the first housing 100, a lengthwise direction of the second guide rail 1100 is parallel to a slide direction of the second housing 200 relative to the first housing 100, and the second slide block 1200 is fixedly connected to the second housing 200, sleeved on the second guide rail 1100, and slidably connected to the second guide rail 1100. In this case, as the second guide rail 1100 is fitted with the second slide block

1200, the second guide rail 1100 is disposed on the first housing 100, and the second slide block 1200 is disposed on the second housing 200, the second slide block 1200 slides relative to the second guide rail 1100 in the case that the second housing 200 slides relative to the first housing 100, such that the slide direction of the second housing 200 relative to the first housing 100 is limited by a slide direction of the second slide block 1200 relative to the second guide rail 1100. Thus, the poor phenomenon of shift in sliding the second housing 200 relative to the first housing 100 is avoided. In the present disclosure, the second slide block 1200 is fixedly connected to the support housing 201 in the second housing 200.

Figure 17:
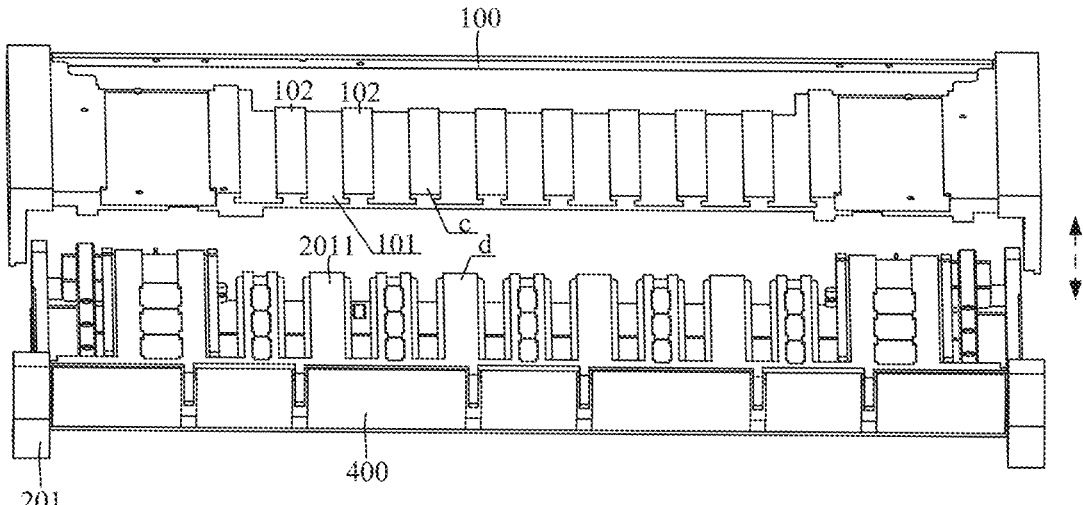
FIG. 17 is an exploded view of partial structure of another display device according to some embodiments of the present disclosure.
Figure 18:
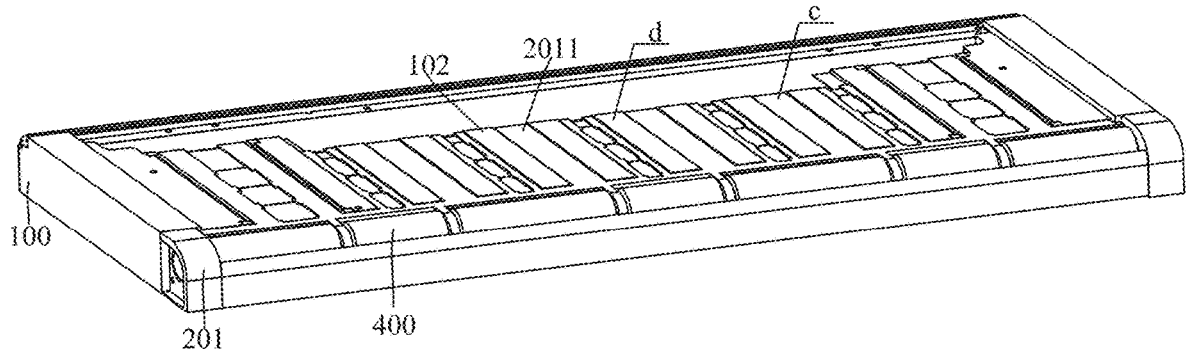
FIG. 18 is a schematic view of an assembly of the display device shown in FIG. 17.

In some embodiments, referring to FIG. 17 and FIG. 18, FIG. 17 is an exploded view of partial structure of another display device according to some embodiments of the present disclosure, and FIG. 18 is a schematic view of an assembly of the display device shown in FIG. 17. The support housing 201 in the second housing 200 is provided with a plurality of guide bars 2011 arranged in parallel. A lengthwise direction of the plurality of guide bars 2011 is perpendicular to an axial direction of the reel 400. The first housing 100 is provided with a plurality of guide chutes 101 in one-to-one correspondence to the plurality of guide bars 2011, and at least part of the plurality of guide bars 2011 are disposed in the corresponding guide chutes 101 and slidably connected to the corresponding guide chutes 101. In this case, as the plurality of guide bars 2011 are in one-to-one fit with the plurality of guide chutes 101, the stable sliding of the second housing 200 relative to the first housing 100 is further ensured, and the flexible display panel is supported.

Figure 19:
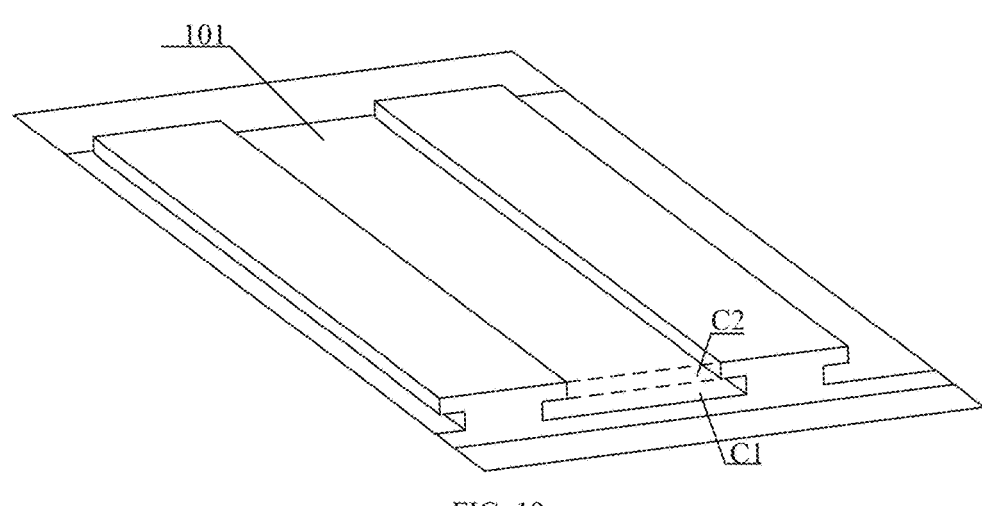
FIG. 19 is a schematic structural view of a dovetail chute according to some embodiments of the present disclosure.

In the present disclosure, the guide chute 101 in the first housing 100 is a dovetail chute, the shape of the guide bar 2011 is matched with the dovetail chute, and at least part of the plurality of guide bars 2011 are disposed in the dovetail chute. In this case, as the guide chute 101 is disposed as the dovetail chute, and the shape of the guide bar 2011 is matched with the dovetail chute, the poor phenomenon of separation of the guide bar 2011 and the guide chute 101 is avoided in the case that the guide bar 2011 slides relative to the guide chute 101, and the use experience of the display device is great. Illustratively, referring to FIG. 19, FIG. 19 is a schematic structural view of a dovetail chute according to some embodiments of the present disclosure. The dovetail chute includes a first groove C1 and a second groove C2 that are connected, and a width of the first groove C1 is greater than a width of the second groove C2.

In the embodiments of the present disclosure, as shown in FIG. 17 and FIG. 18, the first housing 100 is further provided with a plurality of guide protrusions 102. An arrangement direction of the plurality of guide protrusions 102 is parallel to an arrangement direction of the plurality of guide bars 2011, any two adjacent guide protrusions 102 are configured to limit one of the plurality of guide chutes 101, the guide bar 2011 is disposed between two adjacent guide protrusions 102, and a face c, proximal to the planar display portion 301 in the flexible display panel 300, of the guide bar 2011 is flush with a face d, proximal to the planar display portion 301 in the flexible display panel 300, of the guide protrusion 102. In this case, as the plurality of guide protrusions 102 are defined, the guide chute 101 is defined between two adjacent guide protrusions 102, and the face c, proximal to the planar display portion 301 in the flexible display panel 300, of the guide bar 2011 is flush with the face d, proximal to the planar display portion 301 in the flexible display panel 300, of the guide protrusion 102, the face c, proximal to the planar display portion 301 in the flexible display panel 300, of the guide bar 2011 and the face d, proximal to the planar display portion 301 in the flexible display panel 300, of the guide protrusion 102 are both support the flexible display panel 300, and the flatness of the flexible display panel 300 is great.

In some embodiments, as shown in FIG. 16, the reel 400 in the display deice includes a reel core 401 and at least two reel housings 402. Both ends of the reel core 401 are connected to a side, facing away from the first housing 100, of the second housing 200, and the at least two reel housings 402 are sleeved on the reel core 401 and are arranged in an axial direction of the reel core 401. In this case, as the reel housing 402 and the reel core 401 slide relative to each other, the flexible display panel 300 and the reel housing 402 are rolled and frictional in the case that the flexible display panel 300 is wound over the reel 400 and slid and rolled, such that the convenience of sliding and rolling of the flexible display panel 300 is ensured. Illustratively, two, three, or four reel housings 402 are defined, which is not limited in the embodiments of the present disclosure.

In the embodiments of the present disclosure, as shown in FIG. 16, the display device further includes a driving assembly 1300. The driving assembly 1300 is connected to the first housing 100 and the second housing 200 in the display device, and configured to drive the second housing 200 to slide relative to the first housing 100. In this case, as the driving assembly 1300 is disposed in the display device, and the driving assembly 1300 is configured to drive the second housing 200 to slide relative to the first housing 100, the use experience of the user is efficiently improved. In the present disclosure, the display device further includes a control assembly (not shown in the drawing). The control assembly is connected to the driving assembly 1300, and the user controls, by the control assembly, the driving assembly 1300 to drive the second housing 200 to slide relative to the first housing 100.

Figure 20:
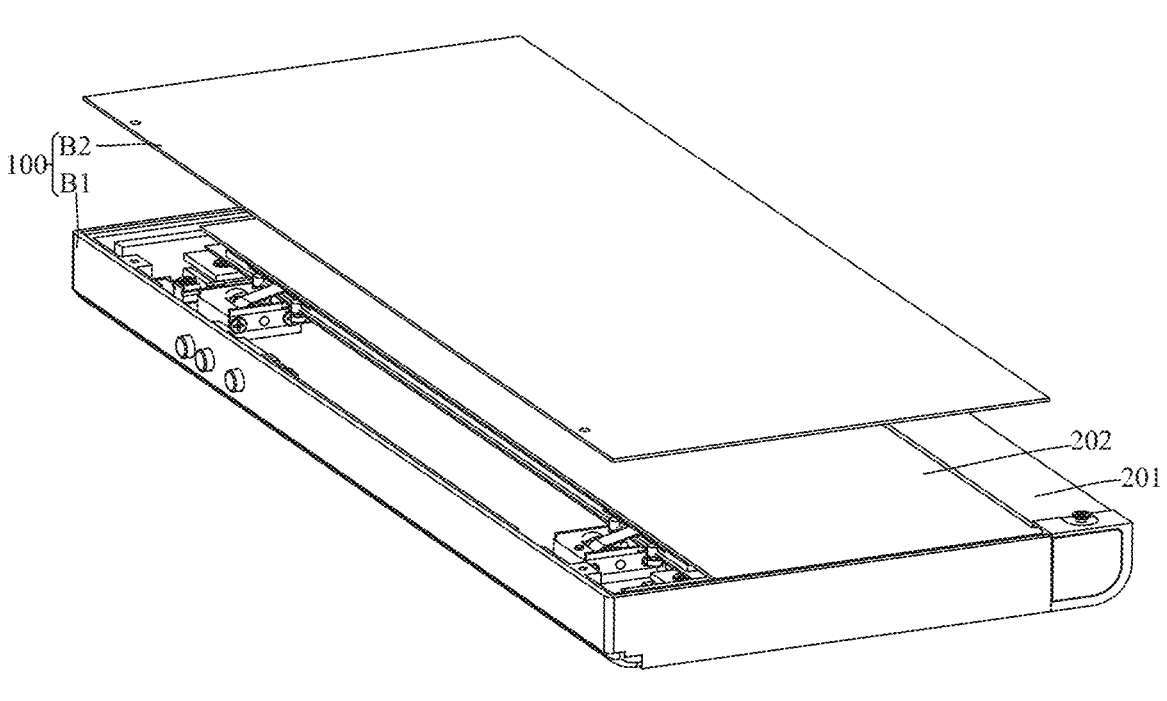
FIG. 20 is an exploded view of partial structure of another display device according to some embodiments of the present disclosure.
Figure 21:
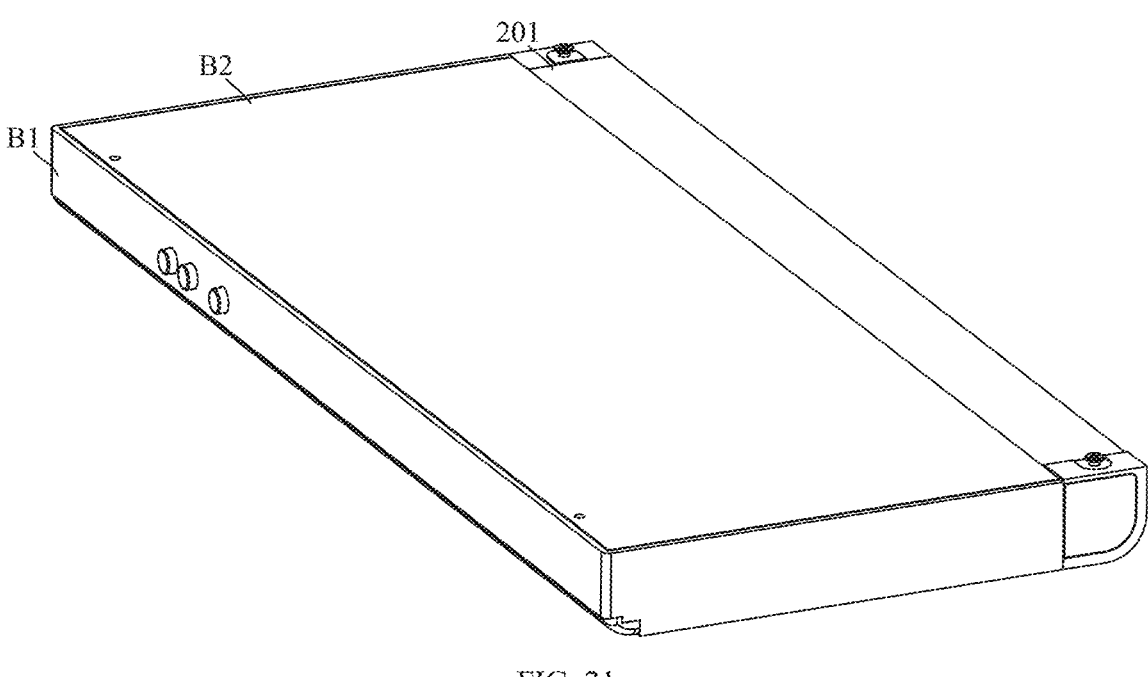
FIG. 21 is a schematic view of an assembly of the display device shown in FIG. 20.

In some embodiments, referring to FIG. 20 and FIG. 21, FIG. 20 is an explosion view of partial structure of another display device according to some embodiments of the present disclosure, and FIG. 21 is a schematic view of an assembly of the display device shown in FIG. 20. The first housing 100 in the display device includes a support housing B1 and a rear cover B2 fixedly connected to the support housing B1. In this case, the rear cover B2 blocks a rear face of the display device, such that the appearance of the display device is great. A front face of the display device is a face on a same side of the planar display portion 301 in the flexible display panel 300, and a rear face of the display device is a face opposite to the front face of the display device.

In summary, a display device is provided in the embodiments of the present disclosure. The display device includes: a first housing, a second housing, a flexible display panel, a reel, a connecting plate, a tension assembly, and a slide support assembly. The tension assembly is connected to the connecting plate connected to the non-display fixed portion in the flexible display panel and the first housing. In the case that the second housing slides relative to the first housing to drive the flexible display panel to unroll and roll, the tension assembly applies a tension force to the flexible display panel, such that a flatness of the flexible display panel is great. In addition, upon unrolling of the flexible display panel with sliding of the second housing in a direction away from the first housing, the flexible display panel can be normally rolled with sliding of the second housing in a direction close to the first housing, such that a risk of wrinkling and damaging the flexible display panel is efficiently reduced, and a service life of the display device is efficiently prolonged. In addition, the slide support assembly connected to the connecting plate is disposed between the connecting plate in the display device and the rear cover in the second housing, such that the slide support assembly is in contact with the rear cover in the second housing, and the connecting plate is slidably connected to the rear cover in the second housing via the slide support assembly. As such, the slide support assembly connected to the connecting plate is in contact with the rear cover in the second housing and slides relative to the rear cover in the second housing in the case that the second housing slides relative to the first housing and the connecting plate connected to the non-display fixed portion in the flexible display panel slides relative to the rear cover in the second housing. Thus, the poor direct contact of the non-display fixed portion in the flexible display panel with the rear cover in the second housing in upwarp of the non-display fixed portion in the flexible display panel is efficiently avoided, the possibility of scratch of the non-display fixed portion in the flexible display panel by the rear cover in the second housing is reduced, the frictional resistance between the non-display fixed portion in the flexible display panel and the rear cover in the second housing is reduced, and the user experience of the display device is efficiently improved.

In the present disclosure, the terms "first" and "second" are only used for the purpose of description and should not be construed as indicating or implying relative importance. Unless otherwise clearly defined, the expression "a plurality of" refers to two or more.

Described above are merely exemplary embodiments of the present disclosure, and are not intended to limit the present disclosure. Any modifications, equivalent replacements, improvements and the like made within the spirit and principles of the present disclosure should be encompassed within the scope of protection of the present disclosure.

The invention claimed is:

1. A display device, comprising:
a flexible display panel, comprising a planar display portion, a rollable display portion, and a non-display fixed portion, wherein the rollable display portion is disposed between the planar display portion and the non-display fixed portion;
a first housing, fixedly connected to the planar display portion;
a second housing, slidably connected to the first housing and comprising a support housing and a rear cover fixedly connected to the support housing;
a reel, wherein both ends of the reel are connected to a side, facing away from the first housing, of the support housing, and the rollable display portion is wound over the reel;
a connecting plate, disposed between the support housing and the rear cover and fixedly connected to the non-display fixed portion;
a tension assembly, connected to the first housing and the connecting plate, and configured to apply a tension force to the flexible display panel via the connecting plate; and
a slide support assembly, disposed between the connecting plate and the rear cover, wherein one side of the slide support assembly is connected to the connecting plate, and the other side of the slide support assembly is in contact with the rear cover, and the connecting plate is slidably connected to the rear cover via the slide support assembly, wherein the slide support assembly comprises at least one set of rolling members, each of the at least one set of rolling members comprising at least one rolling member, wherein the at least one rolling member is movably connected to the connecting plate and in contact with the rear cover; and wherein the slide support assembly comprises one set of rolling members in a central region of the connecting plate, or the slide support assembly comprises a plurality of sets of rolling members, an arrangement direction of the plurality of sets of rolling members being parallel to an axial direction of the reel, and the plurality of sets of rolling members being equally spaced.

2. The display device according to claim 1, wherein at least one first mount groove is defined in a side, proximal to the rear cover, of the connecting plate, wherein the at least one first mount groove is in one-to-one correspondence to the at least one set of rolling members, wherein some rolling members in each of the at least one set of rolling members are disposed in the corresponding first mount groove, and some rolling members in each of the at least one set of rolling members are disposed beyond the first mount groove and in contact with the rear cover.

3. The display device according to claim 2, wherein the rolling members are metal balls, and the display device further comprises at least one magnet secured to a side, facing away from the rear cover, of the connecting plate and in one-to-one correspondence to the at least one set of rolling members, wherein the at least one magnet is configured to apply an attachment force to the rolling members in the corresponding set of rolling members.

4. The display device according to claim 3, wherein at least one second mount groove is defined in the side, facing away from the rear cover, of the connecting plate, wherein the at least one second mount groove is in one-to-one correspondence to the at least one magnet, and the at least one magnet is secured in the corresponding second mount groove.

5. The display device according to claim 1, wherein the tension assembly comprises a guide shaft and a tension belt; wherein the guide shaft is connected to the second housing, an axial direction of the guide shaft is parallel to an axial direction of the reel, and the connecting plate is disposed between the guide shaft and the reel in a slide direction of the second housing relative to the first housing; and a first end of the tension belt is fixedly connected to the connecting plate, a second end of the tension belt is fixedly connected to the first housing upon bypassing the guide shaft, and the tension belt is slidably connected to the guide shaft.

6. The display device according to claim 5, wherein the second housing further comprises a push rod, wherein a lengthwise direction of the push rod is parallel to the slide direction of the second housing relative to the first housing, and one end of the push rod is fixedly connected to the side, facing away from the first housing, of the support housing and the other end of the push rod is connected to the guide shaft.

7. The display device according to claim 6, wherein the connecting plate is provided with at least one set of guide pillars, wherein each of the at least one set of guide pillars comprises two opposite guide pillars, and the push rod is disposed between the two opposite guide pillars and slidably connected to the two opposite guide pillars.

8. The display device according to claim 7, wherein the guide pillar comprises a guide pillar body and a limit ring sleeved on the guide pillar body and movably connected to the guide pillar body, wherein the limit ring is in contact with the push rod.

9. The display device according to claim 6, further comprising: a first guide rail and a first slide block that are disposed between the connecting plate and the push rod, wherein the first guide rail is connected to the push rod, the first slide block is connected to the connecting plate, and the first guide rail is slidably connected to the first slide block.

10. The display device according to claim 9, wherein at least one of the first guide rail and the first slide block is magnetic, and the first guide rail is magnetically connected to the first slide block.

11. The display device according to claim 10, wherein the first guide rail is a magnetic strip with a lengthwise direction being parallel to the lengthwise direction of the push rod, and the first slide block is a magnetic sheet with opposite magnetism to the magnetic strip.

12. The display device according to claim 6, wherein the tension belt comprises a first portion fixedly connected to the connecting plate and a second portion connected to a side, facing away from the connecting plate, of the first portion, wherein the second portion is fixedly connected to the first housing upon bypassing the guide shaft, and a width of the first portion is greater than a width of the second portion in a direction parallel to a lengthwise direction of the connecting plate.

13. The display device according to claim 12, wherein a third mount groove is defined in a side, proximal to the rear cover, of the connecting plate, wherein the first portion is secured in the third mount groove, and a face, proximal to the rear cover, of the first portion is flush with the face, proximal to the rear cover, of the connecting plate.

14. The display device according to claim 1, wherein the connecting plate comprises a first connecting sub-plate and a second connecting sub-plate that are connected to each other; wherein the first connecting sub-plate is connected to the tension assembly, and the slide support assembly is disposed between the first connecting sub-plate and the rear cover; and the second connecting sub-plate is provided with a plurality of fixed protrusions arranged parallel to an axial direction of the reel, and the non-display fixed portion is provided with a plurality of fixed holes in one-to-one correspondence to the plurality of fixed protrusions, wherein the plurality of fixed holes are sleeved on the corresponding fixed protrusions and are fixedly connected to the corresponding fixed protrusions.

15. The display device according to claim 1, further comprising: a second guide rail and a second slide block, wherein the second guide rail is fixed on the first housing, a lengthwise direction of the second guide rail is parallel to a slide direction of the second housing relative to the first housing, and the second slide block is fixedly connected to the second housing, sleeved on the second guide rail, and slidably connected to the second guide rail.

16. The display device according to claim 1, wherein the support housing is provided with a plurality of guide bars arranged in parallel, wherein a lengthwise direction of the plurality of guide bars is perpendicular to an axial direction of the reel; and the first housing is provided with a plurality of guide chutes in one-to-one correspondence to the plurality of guide bars, wherein at least part of the plurality of guide bars are disposed in the corresponding guide chutes and are slidably connected to the corresponding guide chutes.

17. The display device according to claim 16, wherein the first housing is further provided with a plurality of guide protrusions, wherein an arrangement direction of the plurality of guide protrusions is parallel to an arrangement direction of the plurality of guide bars, any two adjacent guide protrusions are configured to limit one of the plurality of guide chutes, the guide bar is disposed between two adjacent guide protrusions, and a face, proximal to the planar display portion, of the guide bar is flush with a face, proximal to the planar display portion, of the guide protrusion.

18. The display device according to claim 17, further comprising: a driving assembly, wherein the driving assembly is connected to the first housing and the second housing, and configured to drive the second housing to slide relative to the first housing.

19. A display device, comprising:

a flexible display panel, comprising a planar display portion, a rollable display portion, and a non-display fixed portion, wherein the rollable display portion is disposed between the planar display portion and the non-display fixed portion;

a first housing, fixedly connected to the planar display portion;

a second housing, slidably connected to the first housing and comprising a support housing and a rear cover fixedly connected to the support housing;

a reel, wherein both ends of the reel are connected to a side, facing away from the first housing, of the support housing, and the rollable display portion is wound over the reel;

a connecting plate, disposed between the support housing and the rear cover and fixedly connected to the non-display fixed portion;

a tension assembly, connected to the first housing and the connecting plate, and configured to apply a tension force to the flexible display panel via the connecting plate; and a slide support assembly, disposed between the connecting plate and the rear cover, wherein one side of the slide support assembly is connected to the connecting plate, and the other side of the slide support assembly is in contact with the rear cover, and the connecting plate is slidably connected to the rear cover via the slide support assembly, wherein the slide support assembly comprises at least one set of rolling members, each of the at least one set of rolling members comprising at least one rolling member, wherein the at least one rolling member is movably connected to the connecting plate and in contact with the rear cover; and wherein at least one first mount groove is defined in a side, proximal to the rear cover, of the connecting plate, wherein the at least one first mount groove is in one-to-one correspondence to the at least one set of rolling members, wherein some rolling members in each of the at least one set of rolling members are disposed in the corresponding first mount groove, and some rolling members in each of the at least one set of rolling members are disposed beyond the first mount groove and in contact with the rear cover.

20. A display device, comprising:

a flexible display panel, comprising a planar display portion, a rollable display portion, and a non-display fixed portion, wherein the rollable display portion is disposed between the planar display portion and the non-display fixed portion;

a first housing, fixedly connected to the planar display portion;

a second housing, slidably connected to the first housing and comprising a support housing and a rear cover fixedly connected to the support housing;

a reel, wherein both ends of the reel are connected to a side, facing away from the first housing, of the support housing, and the rollable display portion is wound over the reel;

a connecting plate, disposed between the support housing and the rear cover and fixedly connected to the non-display fixed portion;

a tension assembly, connected to the first housing and the connecting plate, and configured to apply a tension force to the flexible display panel via the connecting plate; and a slide support assembly, disposed between the connecting plate and the rear cover, wherein one side of the slide support assembly is connected to the connecting plate, and the other side of the slide support assembly is in contact with the rear cover, and the connecting plate is slidably connected to the rear cover via the slide support assembly, wherein the tension assembly comprises a guide shaft and a tension belt; wherein the guide shaft is connected to the second housing, an axial direction of the guide shaft is parallel to an axial direction of the reel, and the connecting plate is disposed between the guide shaft and the reel in a slide direction of the second housing relative to the first housing; and a first end of the tension belt is fixedly connected to the connecting plate, a second end of the tension belt is fixedly connected to the first housing upon bypassing the guide shaft, and the tension belt is slidably connected to the guide shaft; and wherein the second housing further comprises a push rod, wherein a lengthwise direction of the push rod is parallel to the slide direction of the second housing relative to the first housing, and one end of the push rod is fixedly connected to the side, facing away from the first housing, of the support housing and the other end of the push rod is connected to the guide shaft.

* * * * *